(12) United States Patent
Sato et al.

(10) Patent No.: US 8,385,011 B2
(45) Date of Patent: Feb. 26, 2013

(54) IMAGE PICKUP LENS, IMAGE PICKUP APPARATUS, MOBILE TERMINAL, AND MANUFACTURING METHOD OF IMAGE PICKUP LENS

(75) Inventors: Masae Sato, Machida (JP); Takashi Kawasaki, Hachioji (JP)

(73) Assignee: Konica Minolta Opto, Inc., Tokyo (JP)

( * ) Notice: Subject to any disclaimer, the term of this patent is extended or adjusted under 35 U.S.C. 154(b) by 283 days.

(21) Appl. No.: 12/638,815

(22) Filed: Dec. 15, 2009

(65) Prior Publication Data

US 2010/0188759 A1 Jul. 29, 2010

(30) Foreign Application Priority Data

Jan. 27, 2009 (JP) .................................. 2009-015204

(51) Int. Cl.
*G02B 9/04* (2006.01)
*G02B 13/18* (2006.01)
(52) U.S. Cl. ........................................ 359/795; 359/717
(58) Field of Classification Search .................. 359/793, 359/795, 784–788, 791, 771–776, 779–780, 359/763–769, 754–760, 717
See application file for complete search history.

(56) References Cited

U.S. PATENT DOCUMENTS

| | | | |
|---|---|---|---|
| 7,158,312 B2 * | 1/2007 | Yamaguchi et al. | 359/676 |
| 2010/0046096 A1 | 2/2010 | Hirao et al. | |
| 2010/0091387 A1 * | 4/2010 | Hirao et al. | 359/793 |
| 2010/0188555 A1 * | 7/2010 | Hirao et al. | 348/340 |
| 2010/0208125 A1 * | 8/2010 | Baba et al. | 348/340 |
| 2011/0007195 A1 * | 1/2011 | Fukuta | 348/294 |

FOREIGN PATENT DOCUMENTS

| | | |
|---|---|---|
| JP | 2006-323365 | 11/2006 |
| JP | 2008-233884 | 10/2008 |
| JP | 2008-287006 | 11/2008 |
| JP | 2009-236935 | 10/2009 |
| WO | WO 2006/035990 | 4/2006 |
| WO | WO 2008/102648 | 8/2008 |
| WO | WO2008/102773 | 8/2008 |
| WO | WO 2008-102775 | * 8/2008 |
| WO | WO 2009/004965 | 1/2009 |
| WO | WO 2009/004966 | 1/2009 |
| WO | WO 2009-116492 | * 9/2009 |

OTHER PUBLICATIONS

Search Report dated May 11, 2010 issued for the corresponding European Search Patent Application No. 09179034.5.
Search Report dated Feb. 25, 2010 issued for the corresponding European Patent Application No. 09179034.5.

\* cited by examiner

*Primary Examiner* — Jordan Schwartz
(74) *Attorney, Agent, or Firm* — Cozen O'Connor

(57) ABSTRACT

An image pickup lens includes a first lens block with a positive refractive power, a second lens block with a negative refractive power, and an aperture stop. The first lens block includes a first lens substrate, and lens portions $1a$ and $1b$ arranged on the first lens substrate. The lens portions $1a$ and $1b$ are different from the first lens substrate in at least one of a refractive index and an Abbe number. The second lens block includes a second lens substrate, and lens portions $2a$ and $2b$ arranged on the second lens substrate. The lens portions $2a$ and $2b$ are different from the second lens substrate in at least one of a refractive index and an Abbe number. The image pickup lens satisfies predetermined conditions relating to a refractive index of the lens portion $2b$, and composite thicknesses of the first lens block and the second lens block.

13 Claims, 19 Drawing Sheets

IMAGE PICKUP LENS, IMAGE PICKUP APPARATUS, MOBILE TERMINAL, AND MANUFACTURING METHOD OF IMAGE PICKUP LENS

Priority is claimed on Japanese Patent Application No. 2009-015204 filed on Jan. 27, 2009 in the Japanese Patent Office, the entire contents of which is hereby incorporated by reference.

TECHNICAL FIELD

The present invention relates to an image pickup lens for an image pickup apparatus employing a solid-state image pickup element such as an image sensor of CCD (Charge Coupled Devices) type and an image sensor of CMOS (Complementary Metal-Oxide Semiconductor) type. More particularly, it relates to an image pickup lens in an optical system employing a wafer-scale lens suitable for mass production, an image pickup apparatus employing the image pickup lens, a mobile terminal employing the image pickup apparatus, and a manufacturing method of the image pickup lens.

BACKGROUND

A compact and thin-type image pickup apparatus has come to be mounted on a mobile terminal representing a compact and thin-type electronic hardware such as a cell-phone and PDA (Personal Digital Assistant), whereby, it has become possible to transmit mutually not only voice information but also image information to a remote location.

As image pickup elements used for these image pickup apparatuses, a solid-state image pickup element such as an image sensor of a CCD type and an image sensor of a CMOS type are used. In recent years, increase of pixel numbers of the image pickup element have been advanced, and enhancement of its resolution and performance have been attained. As a lens for forming an image of a photographic object on the image pickup element, a lens made by resin that is suitable for mass production has come to be used for further cost reduction. In addition, the lens made by resin is excellent in terms of its workability and has satisfied requirements for enhancement of its performance, by being formed in an aspheric shape.

As an image pickup lens of this kind used for an image pickup apparatus housed in a mobile terminal, an optical system of a three-element structure including three plastic lenses and an optical system of a three-element structure including one glass lens and two plastic lenses are widely known. However, a demand for further compactness for these image pickup lenses and a demand for mass productivity required for the mobile terminal are becoming stronger, and achieving both demands is becoming more difficult.

To solve these problems, there has been proposed a method to produce a large number of lens modules as followings. There is provided a glass substrate in a size of several inches, which is formed in a parallel flat plate. A large amount of lens elements are simultaneously formed on the glass substrate through a replica method. Then, the glass substrate (lens wafer) on which a large number of lens elements are formed is combined with a sensor wafer and is cut up to produce a large number of lens modules. Lenses manufactured by this method are called wafer-scale lenses, and lens modules manufactured by this method are called wafer-scale lens modules.

Additionally to the method to produce a large number of lens modules, there has recently been suggested a method to mount the large number of lens modules on a substrate at low cost, as followings. Lens modules are arranged together with IC (Integrated Circuit) chips and other electronic parts on a substrate on which solder is applied in advance. By adding reflow processing (heating processing) to the substrate to melt the solder as the lens modules are arranged thereon, the electronic components and the lens modules are simultaneously mounted on the substrate. Image pickup lenses that withstand the reflow processing and are excellent in heat resistance is also demanded.

As such the image pickup lens, there are proposed lenses shown in JP-B Nos. 3929479 and 3976781 and JP-A Nos. 2006-323365 and 2008-233884, which are structured by two lens blocks.

SUMMARY

In the image pickup lenses shown in JP-B Nos. 3929479 and 3976781, lens portions are formed of the same material. Therefore, chromatic aberration is not sufficiently corrected.

In the image pickup lens shown in JP-A No. 2006-323365, a diffraction surface is employed and it rises the degree of difficulty in manufacturing. Further, diffraction efficiency decreases for a wavelength other than a wavelength used for the design, and a diffracted light of unwanted order is generated to cause a problem of ghost.

In the image pickup lens shown in JP-A No. 2008-233884, lens portions are formed with different materials from each other and chromatic aberration is sufficiently corrected. However, the other aberrations such as distortion are not sufficiently corrected, and such the image pickup lens hardly copes with a solid-state image pickup apparatus with a larger number of pixels.

The present invention has been achieved in view of the aforesaid situations, to provide an image pickup lens, an image pickup apparatus employing the image pickup lens, a mobile terminal employing image pickup apparatus, and a manufacturing method of the image pickup lens. The image pickup lens can be an optical system with high heating resistance and less deterioration in terms of lens property caused by manufacturing errors, and such the image pickup lenses can be mass-produced as wafer-scale lenses. Further, compact image pickup lenses with excellent aberration property cane be produced at a low cost.

An image pickup lens relating to the present invention includes, in order from an object side thereof: a first lens block with a positive refractive power, a second lens block with a negative refractive power, and an aperture stop. The first lens block includes a first lens substrate being a parallel flat plate and lens portions 1a and 1b. The lens portions are different from the first lens substrate in at least one of a refractive index and an Abbe number. The second lens block includes a second lens substrate being a parallel flat plate, and lens portions 2a and 2b. The lens portions are different from the second lens substrate in at least one of a refractive index and an Abbe number. The lens portion 1a is arranged on the object side surface of the first lens substrate and an object side surface of the lens portion 1a is a convex surface facing the object side. The lens portion 1b is arranged on the image side surface of the first lens substrate and an image side surface of the lens portion 1b is a concave surface facing an image side. The lens portion 2a is arranged on the object side surface of the second lens substrate and an object side surface of the lens portion 2a is a concave surface facing the object side. The lens portion 2b is arranged on the image side surface of the second lens substrate and an image side surface of the lens portion 2b is in an aspheric shape. The aperture stop arranged on the first lens substrate. The image pickup lens satisfies a predetermined conditions relating to a refractive index of the lens portion 2b, and composite thicknesses of the first lens block and the second lens block.

These and other objects, features and advantages according to the present invention will become more apparent upon reading of the following detailed description along with the accompanied drawings.

BRIEF DESCRIPTION OF THE DRAWINGS

Embodiments will now be described, by way of example only, with reference to the accompanying drawings which are meant to be exemplary, not limiting, and wherein like elements numbered alike in several Figures, in which.

Figure 4A:
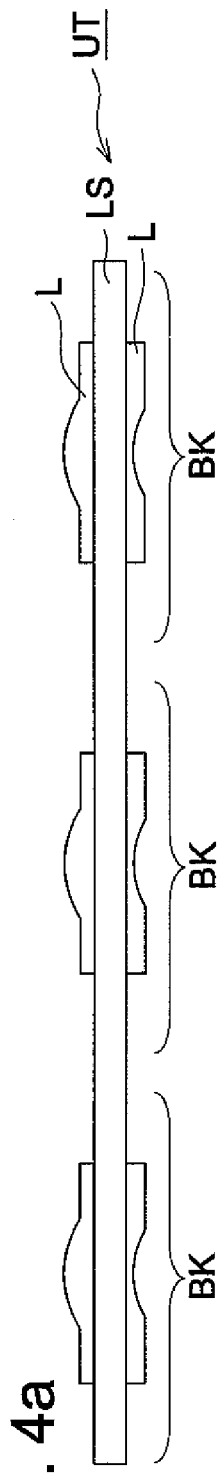
Figure 4B:
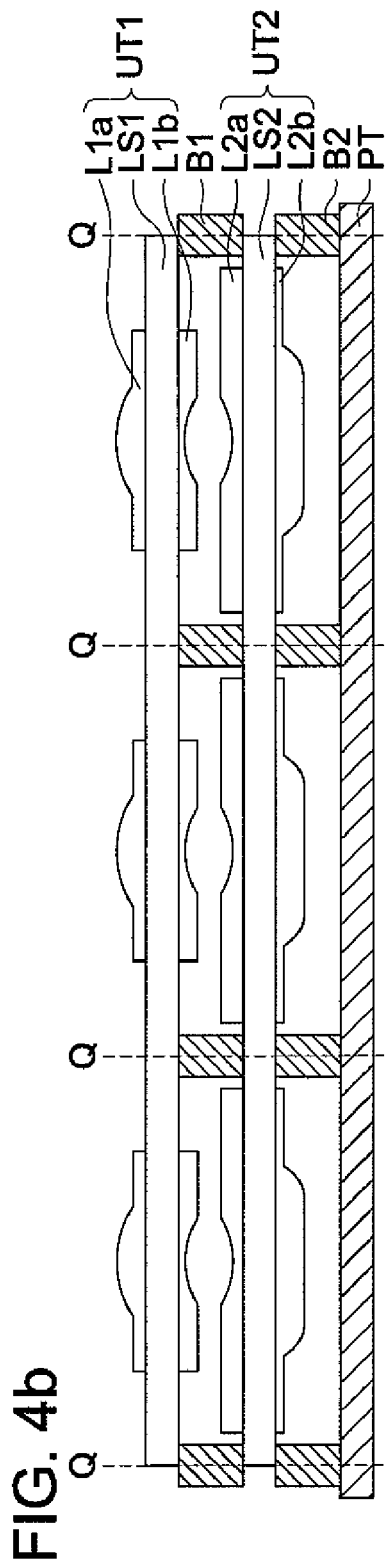
Figure 4C:
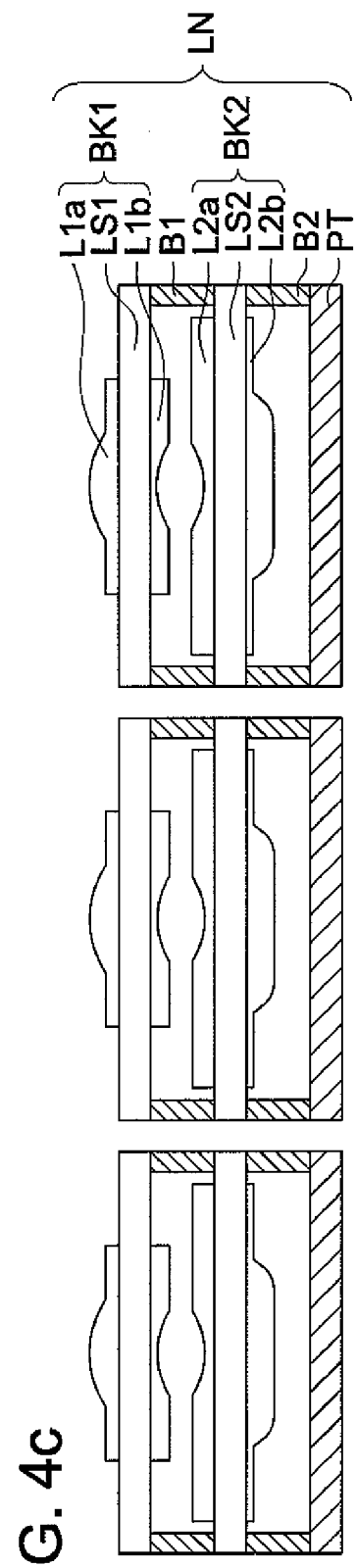
Figure 5:
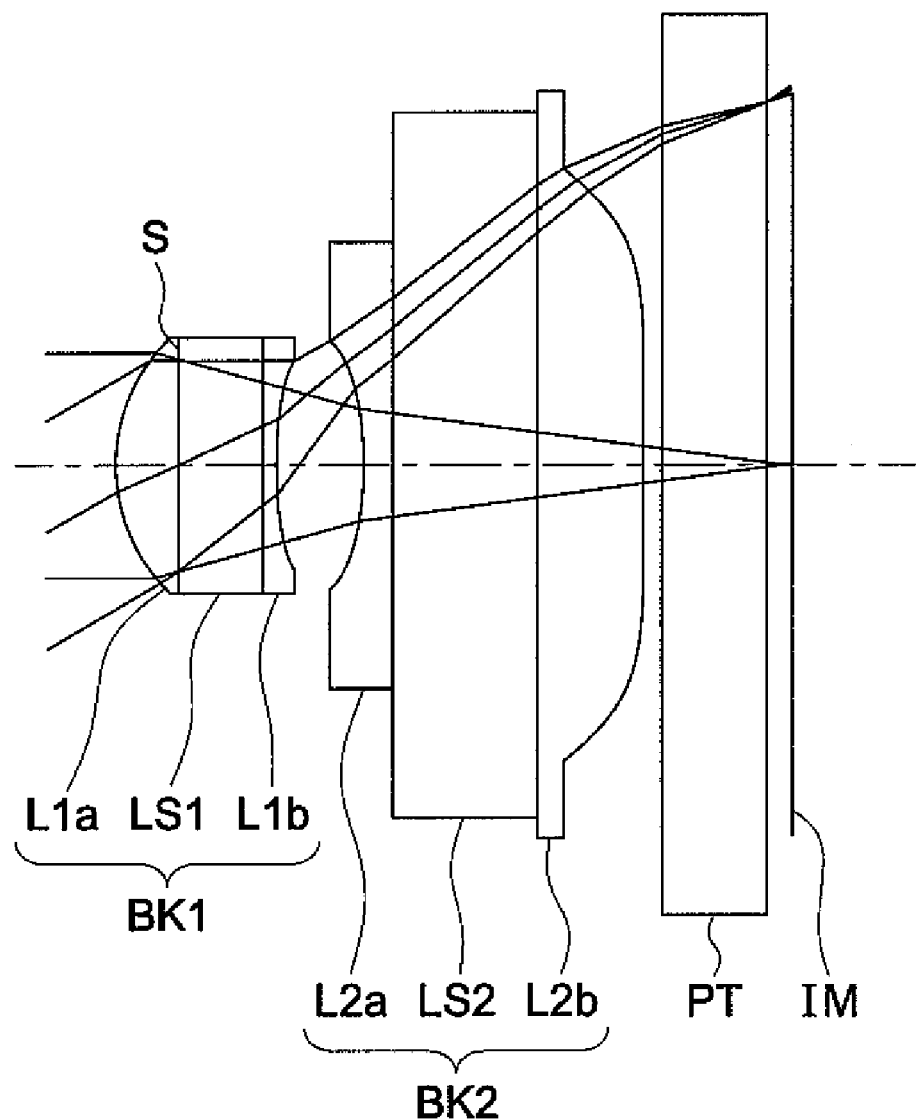
Figure 6:
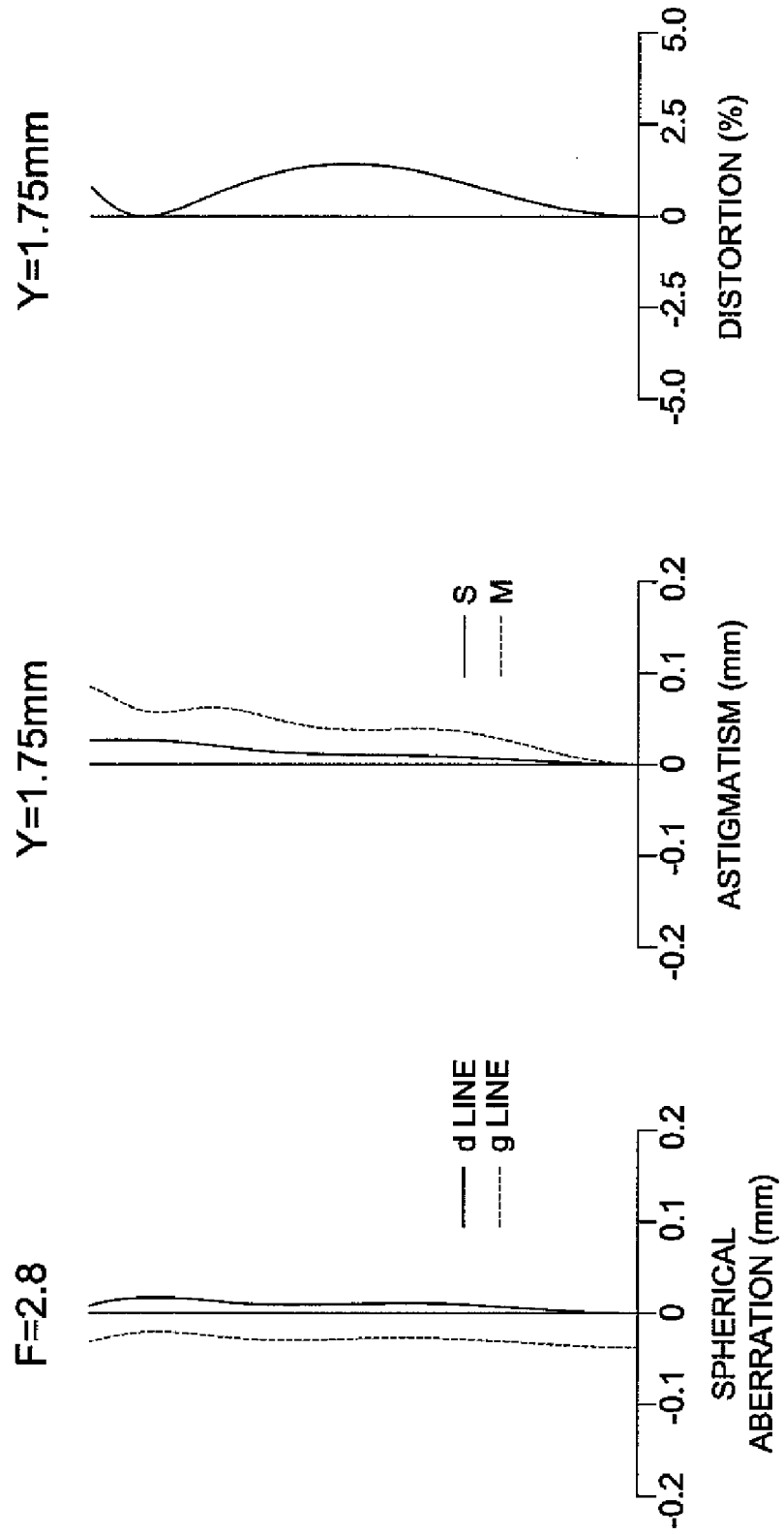
Figure 7:
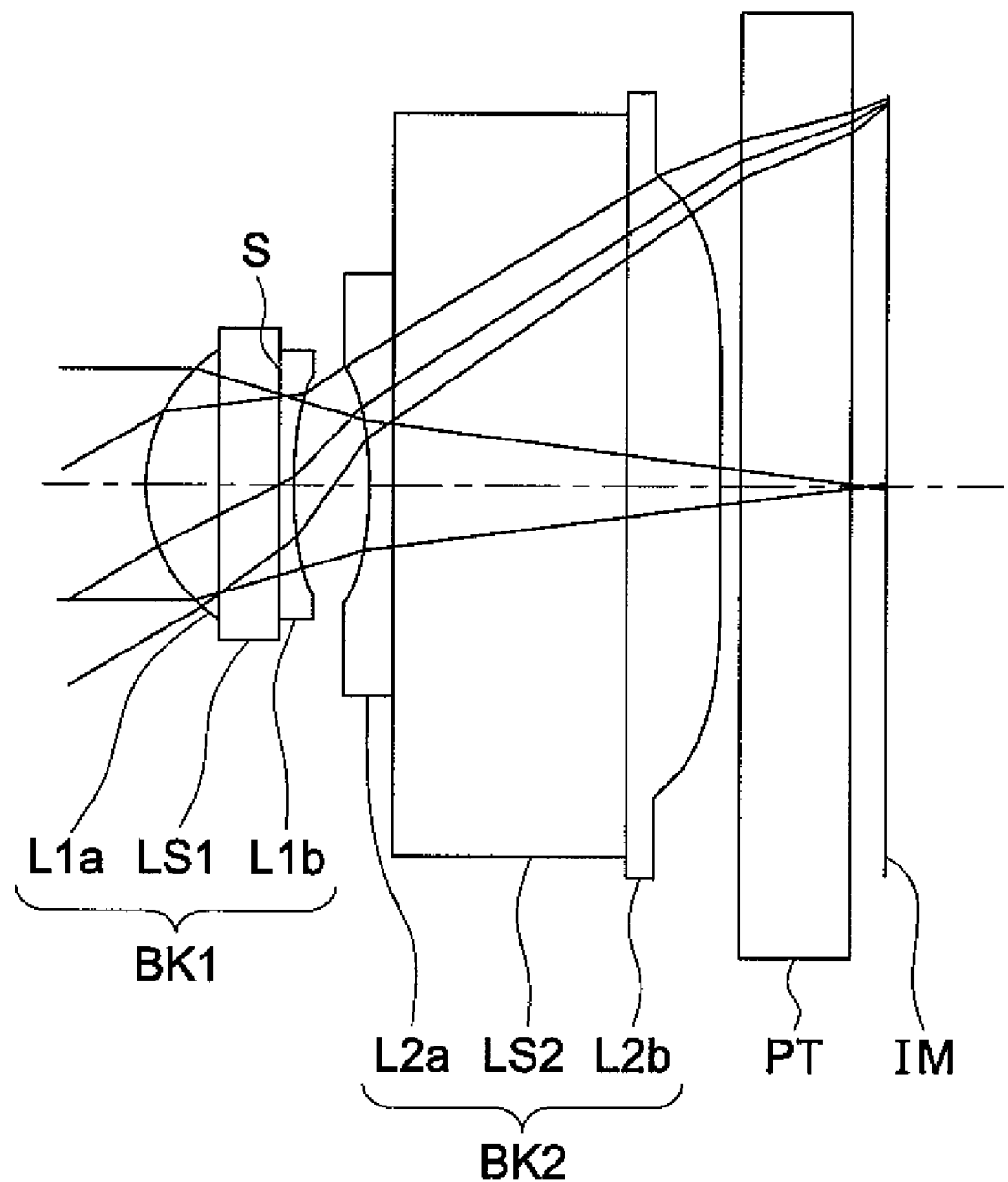
Figure 8:
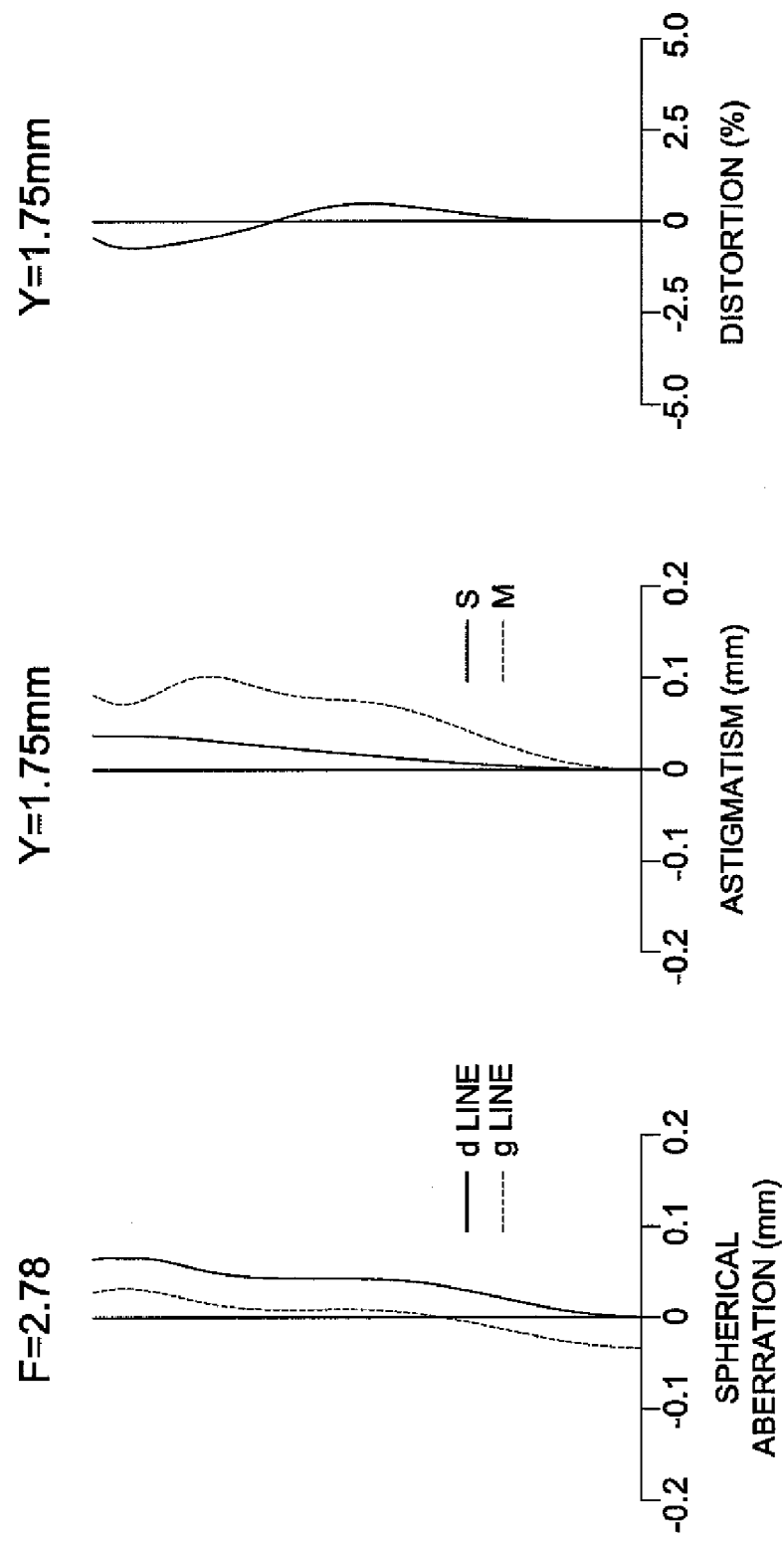
Figure 9:
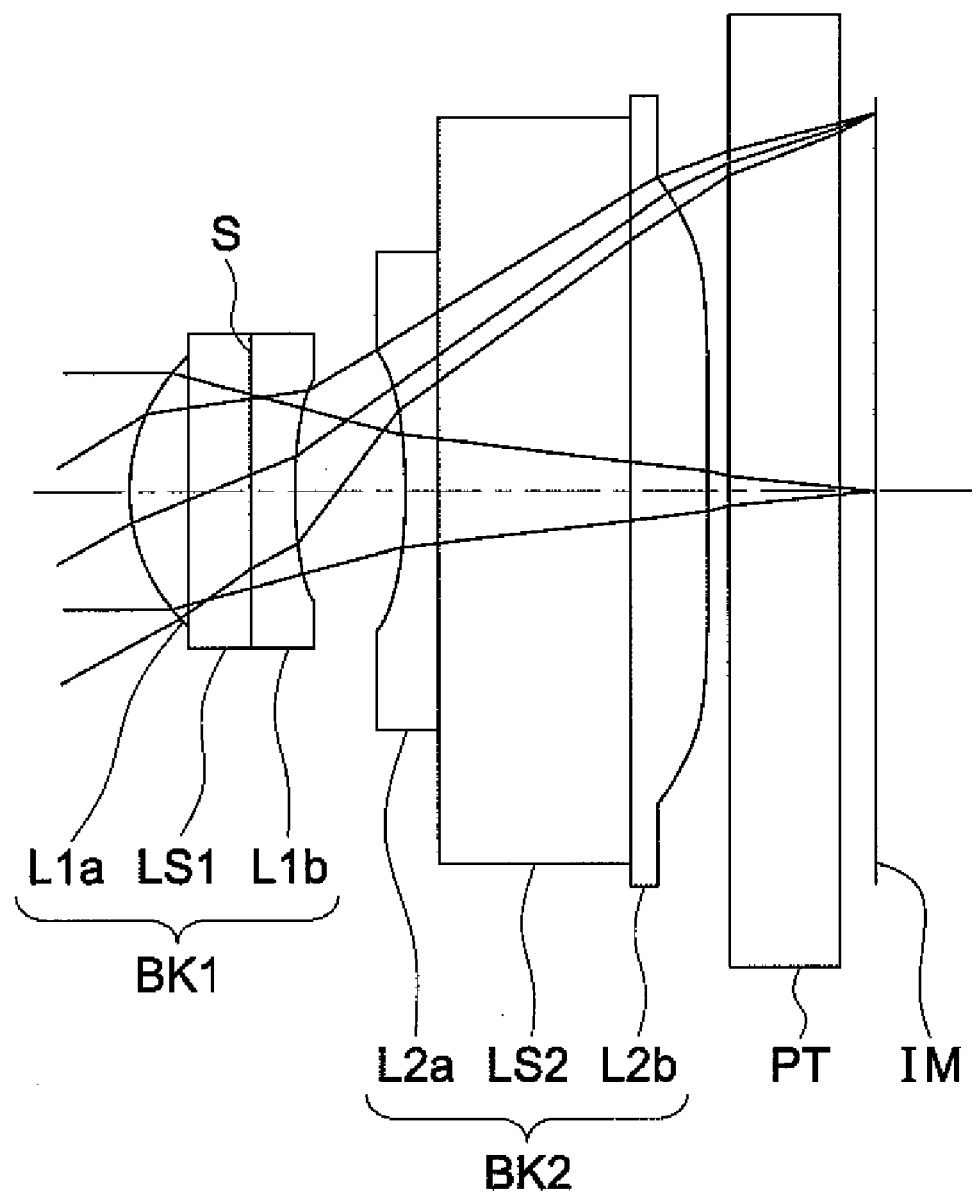
Figure 10:
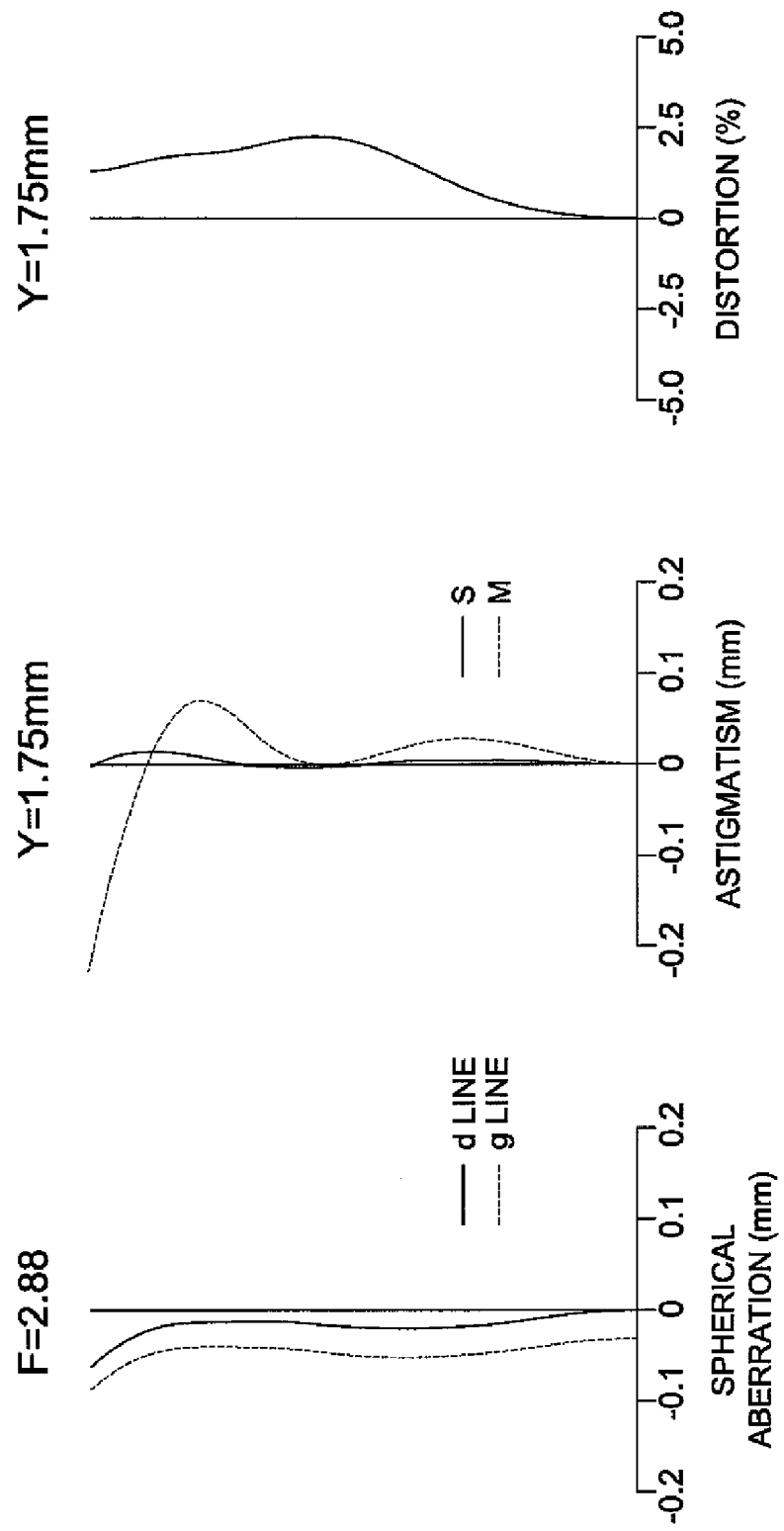
Figure 11:
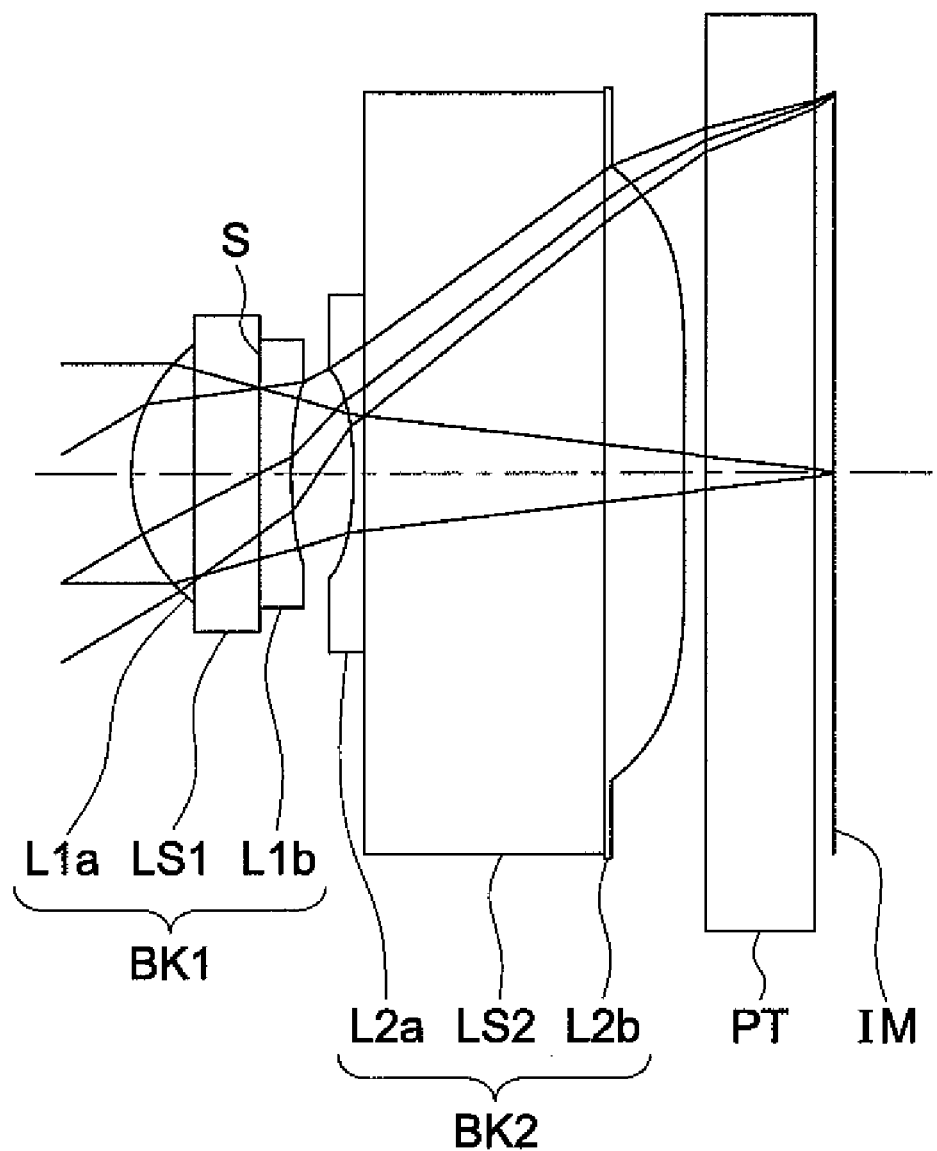
Figure 12:
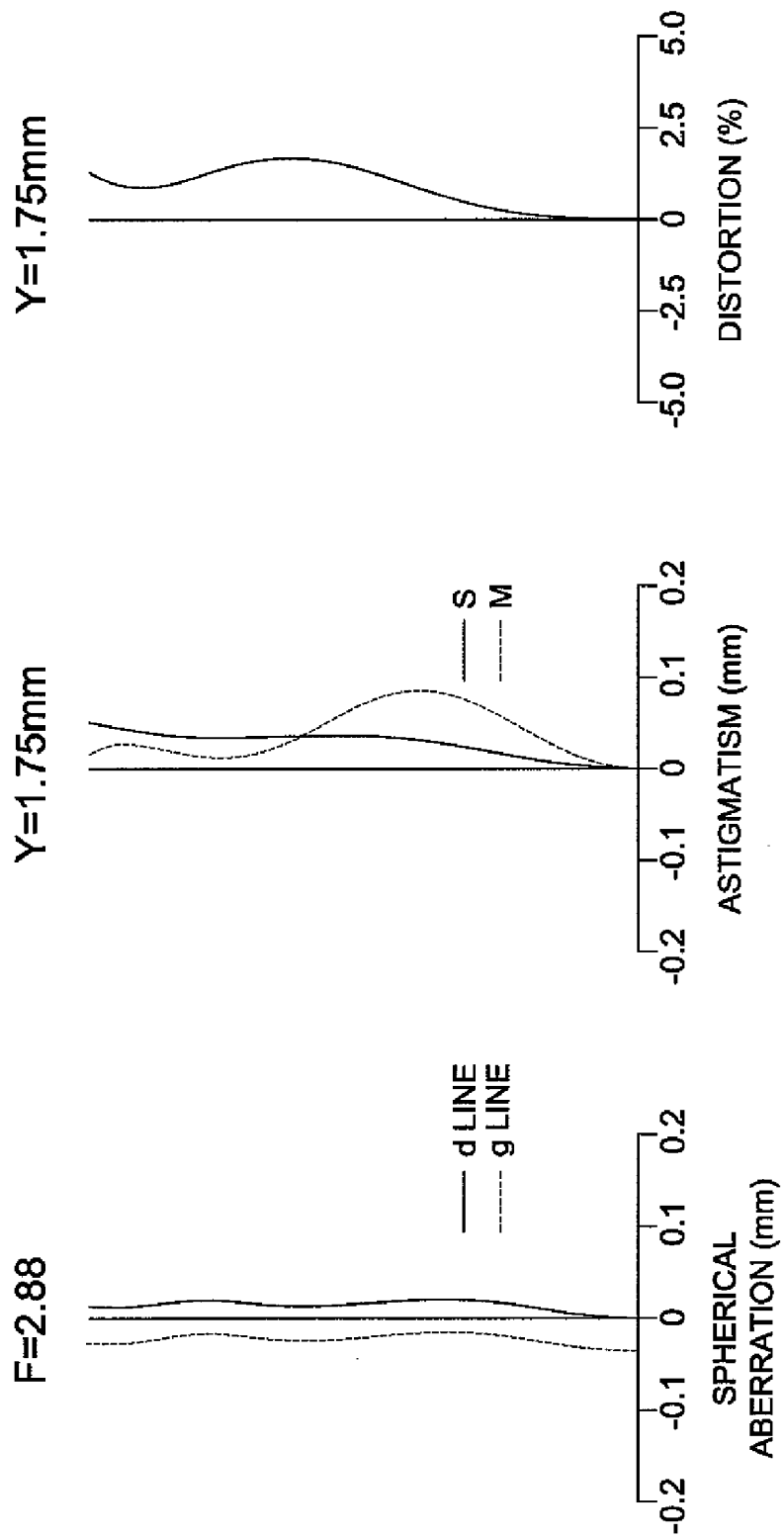
Figure 13:
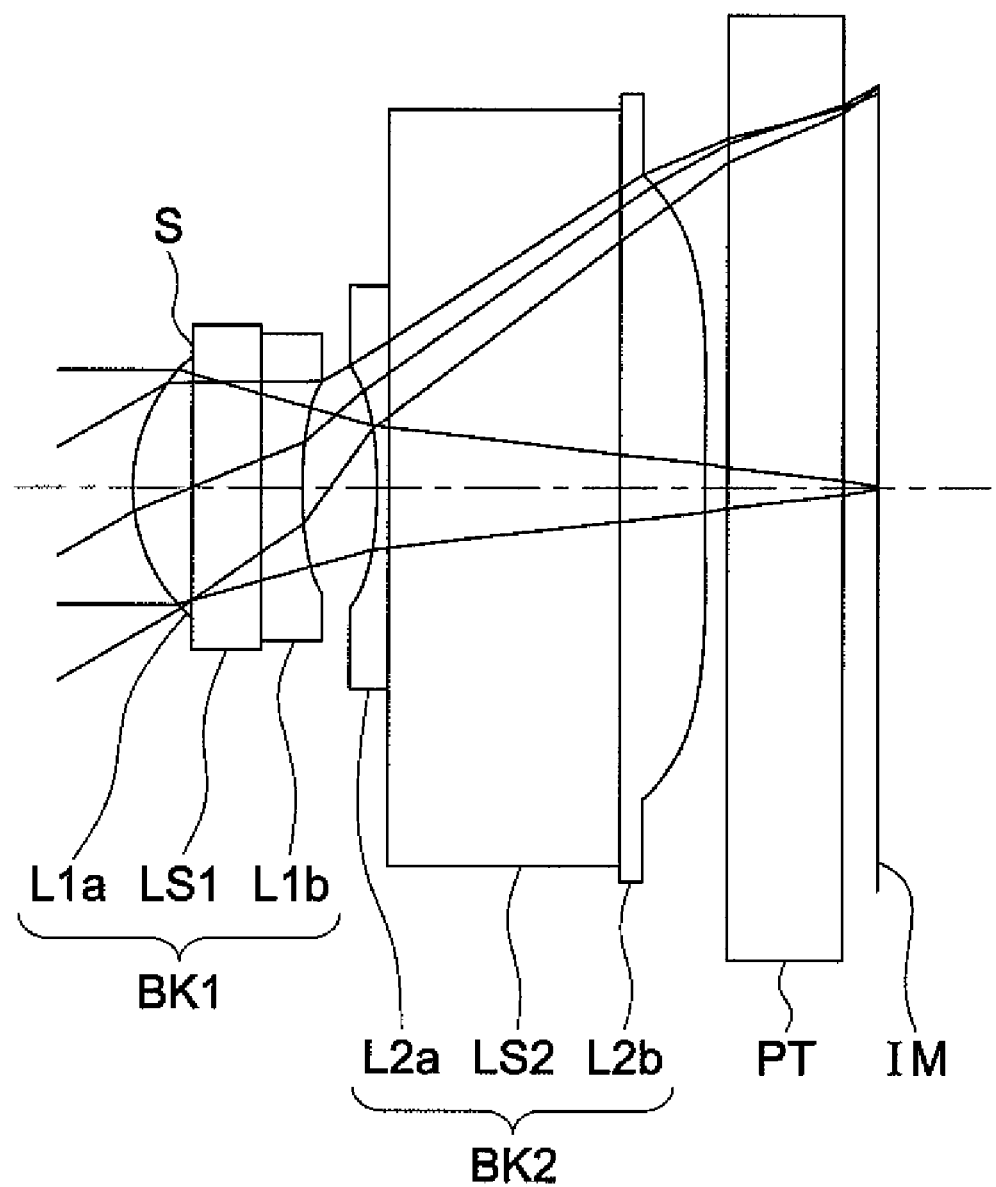
Figure 14:
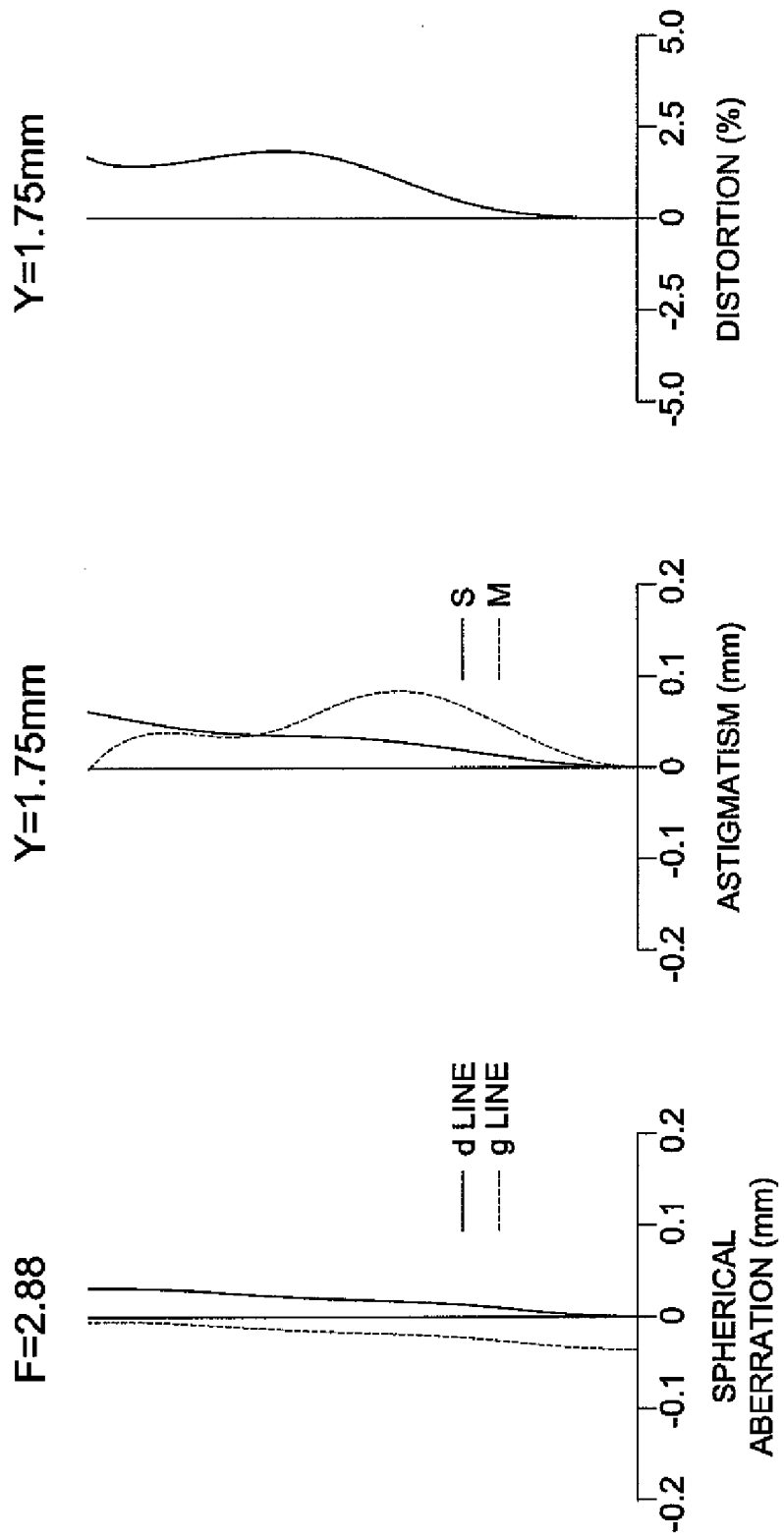
Figure 15:
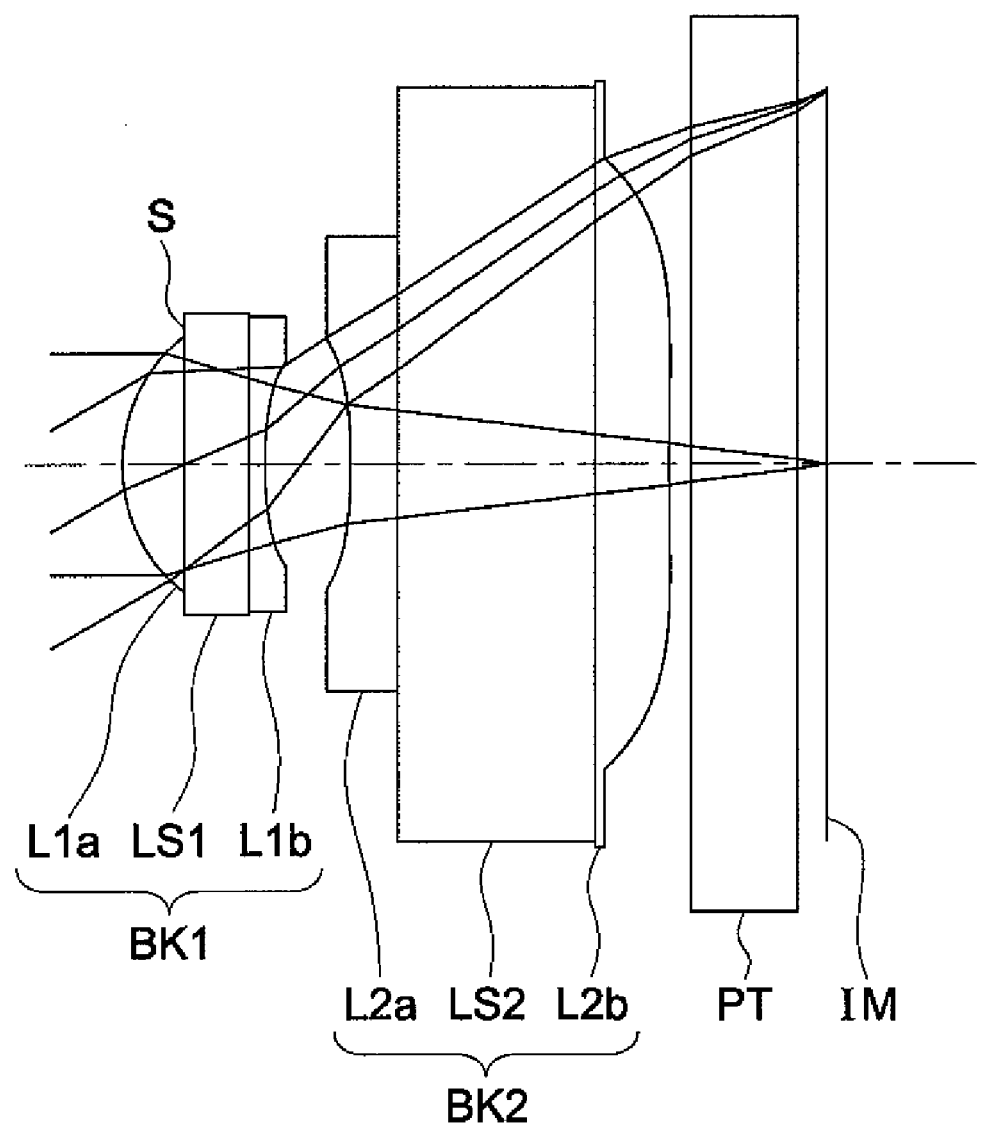
Figure 16:
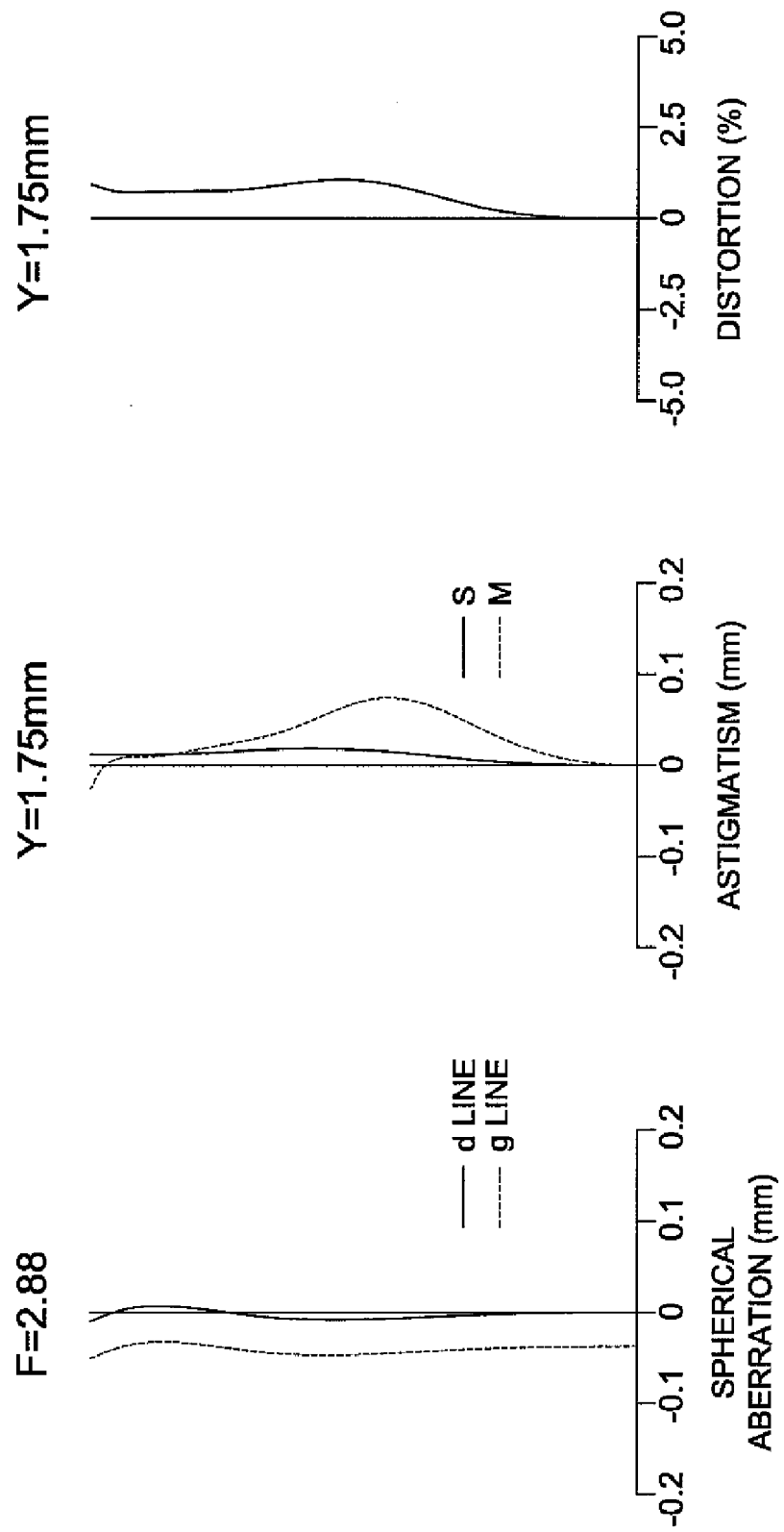
Figure 17:
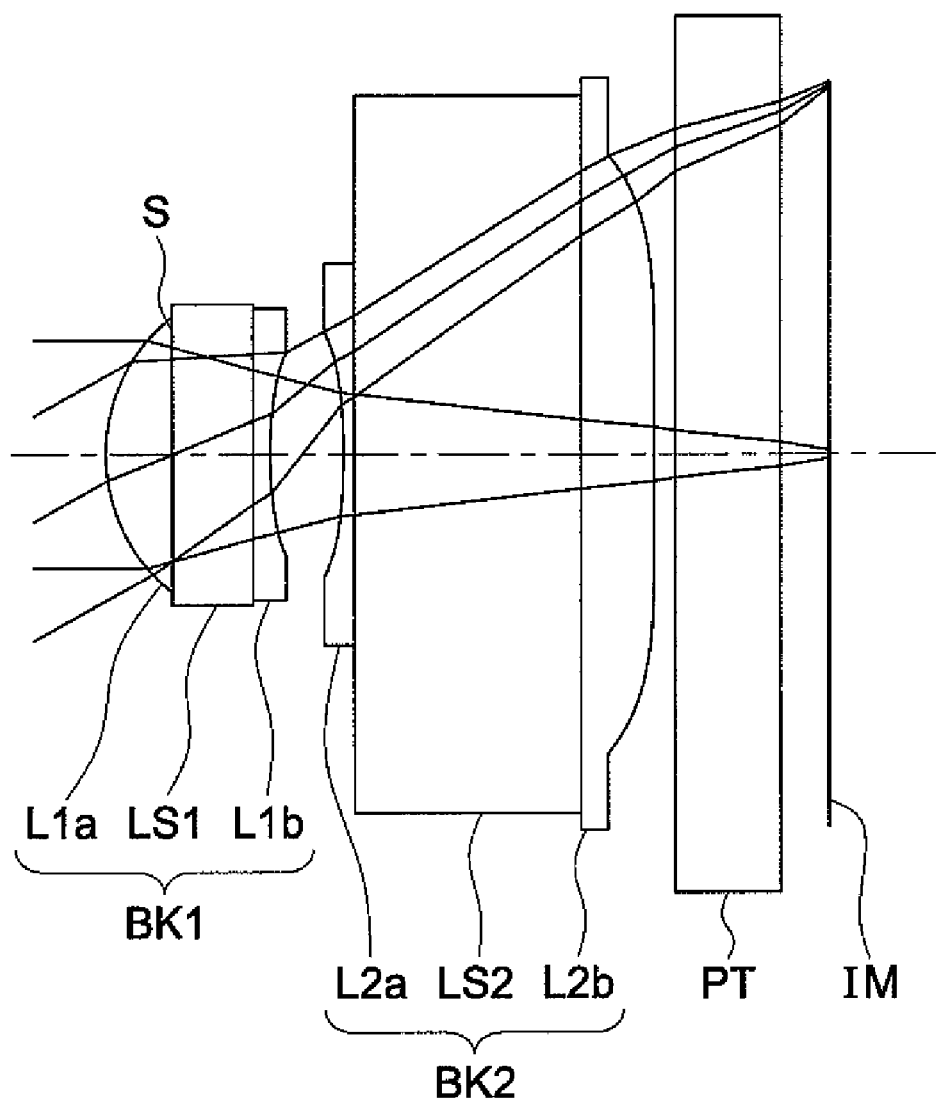
Figure 18:
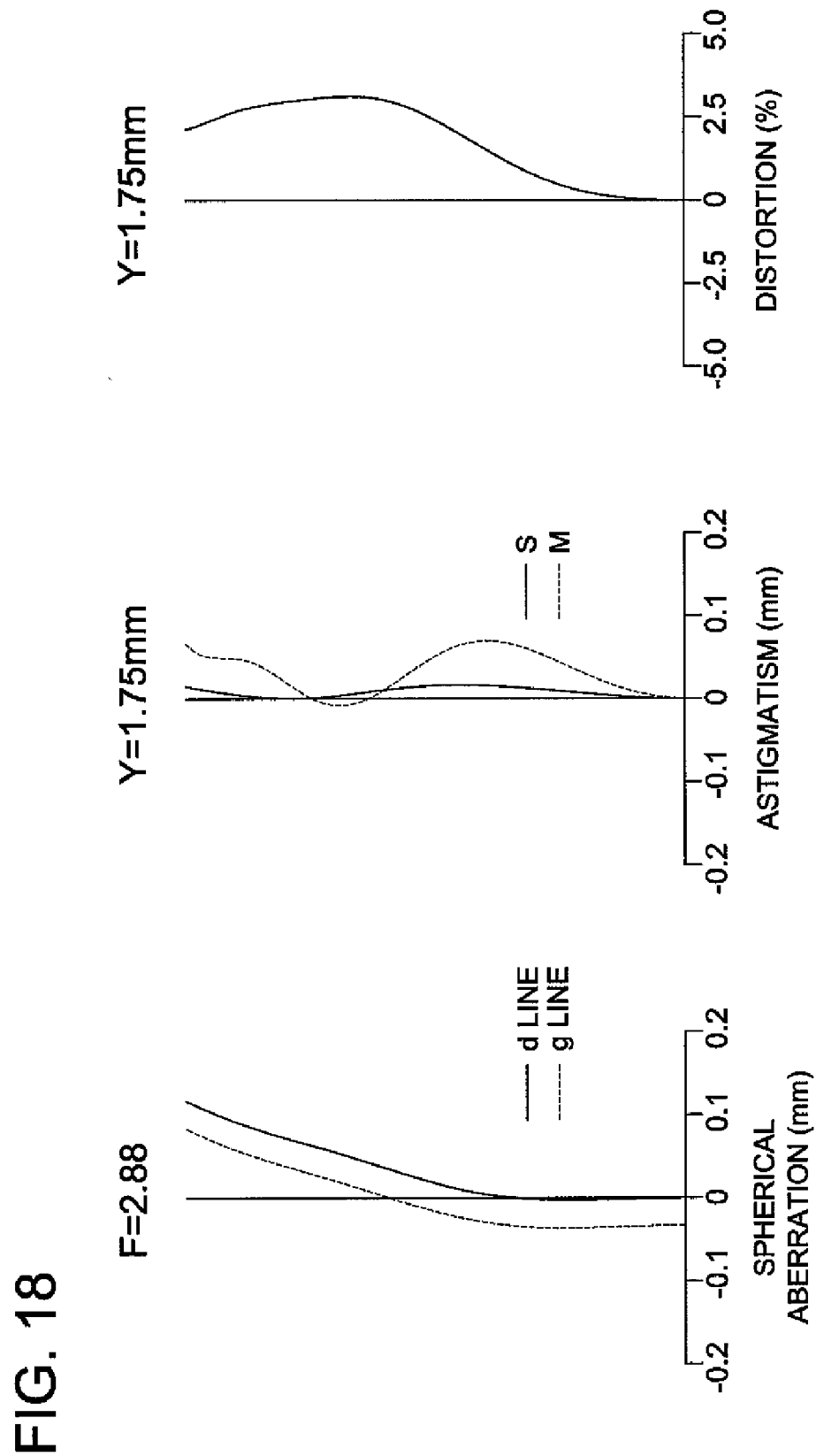

Each of FIGS. 4a, 4b, and 4c is a diagram showing the manufacturing process of an image pickup lens;

FIG. 5 is a cross-sectional view of an image pickup lens in Example 1;

FIG. 6 is a diagram showing spherical aberration, astigmatism and distortion of the image pickup lens in Example 1, respectively;

FIG. 7 is a cross-sectional view of an image pickup lens in Example 2;

FIG. 8 is a diagram showing spherical aberration, astigmatism and distortion of the image pickup lens in Example 2, respectively;

FIG. 9 is a cross-sectional view of an image pickup lens in Example 3;

FIG. 10 is a diagram showing spherical aberration, astigmatism and distortion of the image pickup lens in Example 3, respectively;

FIG. 11 is a cross-sectional view of an image pickup lens in Example 4;

FIG. 12 is a diagram showing spherical aberration, astigmatism and distortion of the image pickup lens in Example 4, respectively;

FIG. 13 is a cross-sectional view of an image pickup lens in Example 5;

FIG. 14 is a diagram showing spherical aberration, astigmatism and distortion of an image pickup lens in Example 5, respectively;

FIG. 15 is a cross-sectional view of an image pickup lens in Example 6;

FIG. 16 is a diagram showing spherical aberration, astigmatism and distortion of the image pickup lens in Example 6, respectively;

FIG. 17 is a cross-sectional view of an image pickup lens in Example 7;

FIG. 18 is a diagram showing spherical aberration, astigmatism and distortion of the image pickup lens in Example 7, respectively.

Figure 19:
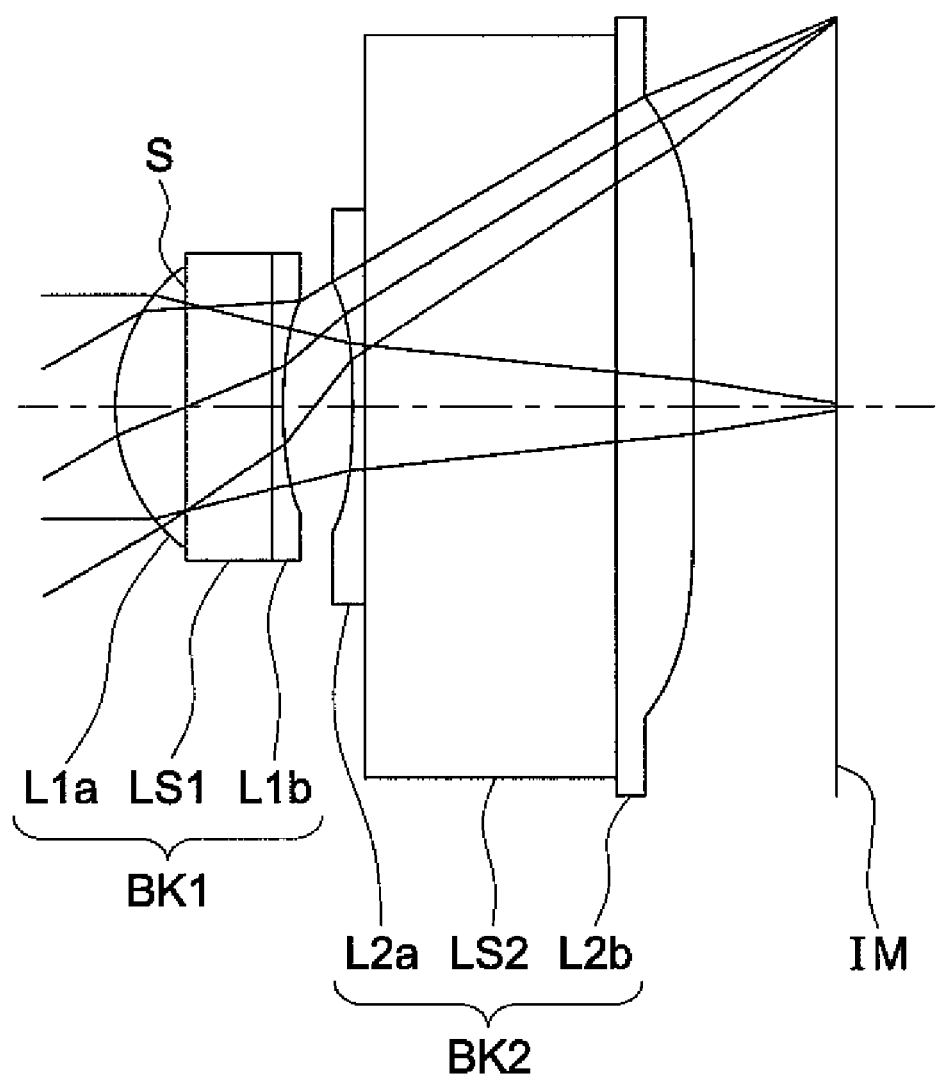
Figure 20:
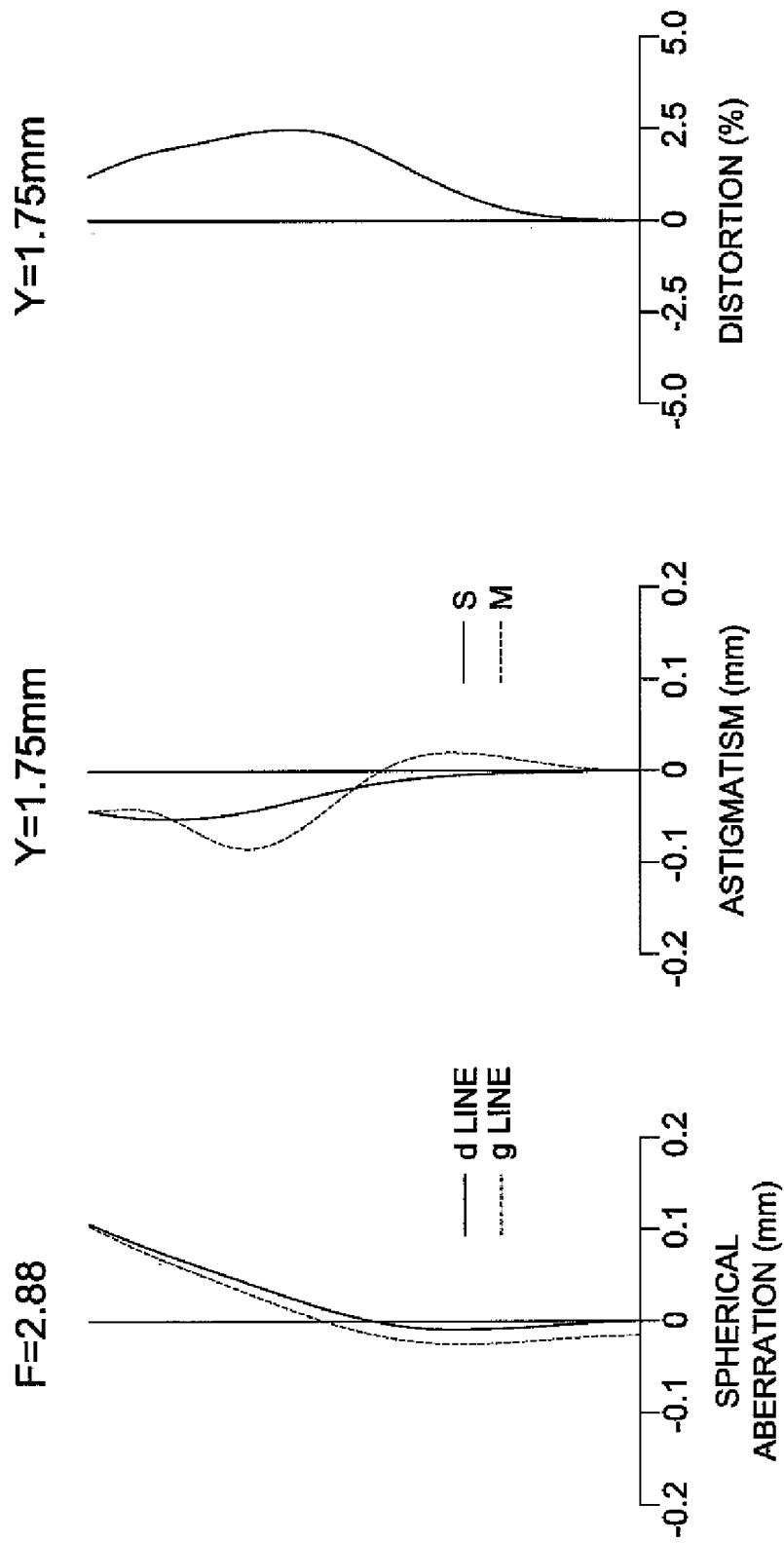

FIG. 19 is a cross-sectional view of an image pickup lens relating to Example 8; and FIG. 20 is a diagram showing spherical aberration, astigmatism and distortion of the image pickup lens in Example 8, respectively.

DESCRIPTION OF EMBODIMENTS

Embodiments of the present invention will be described below.

One of embodiments of the present invention is an image pickup lens comprising, in order from an object side thereof: a first lens block with a positive refractive power, a second lens block with a negative refractive power, and an aperture stop. The first lens block comprises a first lens substrate being a parallel flat plate, and lens portions 1a and 1b arranged on an object side surface and an image side surface of the first lens substrate. The lens portions 1a and 1b are different from the first lens substrate in at least one of a refractive index and an Abbe number. The second lens block comprises a second lens substrate being a parallel flat plate, and lens portions 2a and 2b arranged on an object side surface and an image side surface of the second lens substrate. The lens portions 2a and 2b arranged are different from the second lens substrate in at least one of a refractive index and an Abbe number. The aperture stop arranged on the first lens substrate. The lens portion 1a is arranged on the object side surface of the first lens substrate, and an object side surface of the lens portion 1a is a convex surface facing the object side. The lens portion 1b is arranged on the image side surface of the first lens substrate, and an image side surface of the lens portion 1b is a concave surface facing an image side. The lens portion 2a is arranged on the object side surface of the second lens substrate, and an object side surface of the lens portion 2a is a concave surface facing the object side. The lens portion 2b is arranged on the image side surface of the second lens substrate, and an image side surface of the lens portion 2b is in an aspheric shape. The image pickup lens satisfies the following expressions.

$$1.51 < N2b < 2.0 \quad (1)$$

$$1.7 < D[BK2]/D[BK1] < 3.0 \quad (2)$$

In the expressions, N2b is a refractive index of the lens portion 2b at d line, D[BK1] is a composite thickness of the first lens block, and D[BK2] is a composite thickness of the second lens block.

In the image pickup lens, the lens portion 1a is in a convex shape facing the object side. Therefore, the lens portion 1a provides a positive refractive power and brings a principal point of the overall image pickup lens system close to the object side, which reduces the size of the image pickup lens.

In the embodiment, the composite thickness of the first lens block is a total thickness of a lens substrate and lens portions constituting the first lens block. Similarly, the composite thickness of the second lens block is a total thickness of a lens substrate and lens portions constituting the second lens block. Further, the total thickness is measured along the optical axis.

Further, the lens portion 1b is in a concave shape facing the image side and the lens portion 2a is in a concave shape facing the object side. Therefore, the lens portions 1b and 2a provide a strong negative refractive power and reduce the Petzval's sum, which corrects field curvature satisfactorily.

Further, the lens portion 2b is arranged at the closest portion to the image and is close to a solid-state image pickup element. Since separated light fluxes enters the lens portion 2b, the lens portion 2b in aspheric shape efficiently correct aberrations, namely the lens portion 2b sufficiently exhibits the action of its aspheric shape.

Arranging an aperture stop on a lens substrate means that an aperture stop is arranged between a lens portion and a lens substrate. Owing to this, it is possible to reduce optical members. Further, when conducting vacuum evaporation processing for forming IR (Infra Red) cut coating and AR (Anti- Reflection) coating, it is possible to form an aperture stop simultaneously with the IR cut coating and AR coating through the vacuum evaporation processing, which results in cost reduction and an improvement of productivity for mass production. Meanwhile, it is preferable to arrange the aperture stop on the object side of the lens substrate of the first lens block. Arranging the aperture stop to be closest to the object in the image pickup lens makes it possible to keep a position of an exit pupil away from an image pickup element, and to improve the telecentricity of the image pickup lens.

The lens substrate is formed into a parallel flat plate. It makes its processing easy, and makes no power on the boundary of the lens portion and the lens substrate to reduce an influence of a surface accuracy of the lens substrate on the position of the focal point on an image surface. Further, the lens substrate can be formed into the same shape as a wafer, which allows easy assembling of a wafer-scale lens.

Further, the lens portions can employ a material which is different from the lens substrate in at least one of a refractive index and an Abbe number. Therefore, a degree of freedom for designing the image pickup lens increases and aberrations can be corrected satisfactorily, because various refractive numbers and Abbe numbers can be used for the design.

When manufacturing wafer-scale lenses, it is necessary to make a thickness of the lens portions thinner than those manufactured by an existing manufacturing method. In the present embodiment, the lens portion $2b$ is arranged to be closest to the image, and has a large outer diameter. By forming the lens portion of a material whose refractive index is high, the thickness of the lens portion can be controlled not to be thicker. The expression (1) is a conditional expression that establishes a refractive index of the lens portion $2b$ properly for correcting aberrations satisfactorily while controlling the thickness of the lens portion. When a value of the expression (1) exceeds the lower limit, the thickness of the lens portion $2b$ becomes thin, which allows easy mass production. On the other hand, when a value of the expression (1) is lower than the upper limit, the lens portion can be formed of a material that is available easily, which allows the cost reduction.

Meanwhile, the following conditional expression is more preferable.

$$1.53 < N2b < 1.9$$

The following conditional expression is further more preferable.

$$1.55 < N2b < 1.8$$

The expression (2) is a conditional expression for correcting astigmatism and field curvature by setting a thickness of the second lens block to be thicker than that of the first lens block. A light flux which is emitted from the first lens block and enters the second lens block is diverged by a concave surface on the object side of lens portion $2a$, and separated at each image height. The separated light flux at each image height enters the lens portion $2b$. When a value of the expression (2) exceeds the lower limit, the light flux at each image height to enter the lens $2b$ can be separated sufficiently from the others. Therefore, the aspheric surface of the lens portion $2b$ can easily corrects aberrations caused at each image height. On the other hand, when a value of the expression (2) is lower than the upper limit, a thickness of the first lens block can be controlled not to become excessively thin. It does not worsen the productivity and the image pickup lenses are mass-produced with keeping its excellent property.

Meanwhile, the following conditional expression is more preferable.

$$1.72 < D[BK2]/D[BK1] < 2.7$$

The following conditional expression is further more preferable.

$$1.72 < D[BK2]/D[BK1] < 2.5$$

Further, it is preferable that the image pickup lens satisfies the following expressions.

$$1.51 < N1b < 2.0 \quad (3)$$

$$1.51 < N2a < 2.0 \quad (4)$$

In the aforesaid expressions, N1b is a refractive index of the lens portion $1b$ at d line, and N2a is a refractive index of the lens portion $2a$ at d line.

Each of the expressions (3) and (4) is a conditional expression for easily correcting coma and field curvature by properly setting refractive indexes of lens portion $1b$ with a negative refractive power and lens portion $2a$ with a negative refractive power. When values of the expressions (3) and (4) exceed the respective lower limits, it is possible to restrain occurrence of coma flare and distortion in an off-axis light flux. On the other hand, when values of expressions (3) and (4) are lower than the respective upper limits, it is possible to set the Petzval's sum properly, and the field curvature can be corrected easily. Further, these lens portions can be formed out of materials that are easily available, to contribute to cost reduction.

Incidentally, the following conditional expressions are more preferable.

$$1.53 < N1b < 1.9$$

$$1.53 < N2a < 1.9$$

The following conditional expressions are further more preferable.

$$1.55 < N1b < 1.8$$

$$1.55 < N2a < 1.8$$

In the image pickup lens of the present embodiment, it is preferable that the image side surface of the lens portion $2b$ is in a shape including an inflection point such that the shape is formed in a concave surface facing the image side around an optical axis and is formed in a convex surface facing the image side on a peripheral area.

When the image side surface of the lens portion $2b$ is formed into a concave surface facing the image side around the optical axis, the lens portion $2b$ has a negative refractive index to constitute a lens structure of so called a telephoto type. In the telephoto-type structure, a position of the principal point of the total of the image pickup lens is located closer to the object. Therefore, a back focus of the image pickup lens does not become excessively long, and it is advantageous for downsizing of the total length of the lens. Further, when the lens portion $2b$ is formed into a convex shape in the periphery of the lens portion, light fluxes are properly converged on the periphery of the formed image, which realize a correction of distortion and enhancement of telecentricity with keeping them in a good balance.

Further, it is preferable that the image pickup lens satisfies the following expression.

$$0.3 < |f1|/|f2| < 0.8 \quad (5)$$

In the expression, f1 is a composite focal length of the first lens block, and f2 is a composite focal length of the second lens block.

When a value of the expression (5) exceeds the lower limit, negative refractive power of the second lens block does not become too weak compared with the first lens block, and it is possible to move the principal point of the total system of the image pickup lens to be close to the object. Thus, the image pickup lens can be downsized. On the other hand, when a value of the expression (5) is lower than the upper limit, negative refractive power of the second lens block does not become too strong compared with the first lens block, thus, aberrations can be corrected satisfactorily.

Meanwhile, the following conditional expression is preferable.

$$0.33<f1/|f2|<0.75$$

The following conditional expression is further more preferable.

$$0.37<f1/|f2|<0.7$$

Further, it is preferable that the aforesaid image pickup lens satisfies the following expression.

$$-2.0<f1/|f2|<-1.0 \quad (6)$$

In the expression, f1b is a focal length of the lens portion 1b in an air, and f1 is a composite focal length of the first lens block.

The expression (6) is a conditional expression to properly establish a focal length of lens portion 2b based on a focal length of the first lens block established in the expression (5), and to correct aberrations satisfactorily. When a value of the expression (6) exceeds the lower limit, negative power of the lens portion 1b does not become too weak, and the Petzval's sum can be established appropriately, which makes it easy to correct the field curvature. On the other hand, when a value of the expression (6) is lower than the upper limit, negative power of lens portion 1b does not become too strong, and it is possible to restrain occurrence of coma flare in an off-axis light flux and of distortion.

Meanwhile, the following conditional expression is more preferable.

$$-2.0<f1b/f1<-1.2$$

The following conditional expression is further more preferable.

$$-1.85<f1b/f1<-1.3$$

Further, it is preferable that the aforesaid image pickup lens satisfies the following conditional expression.

$$10<v1a-v1b<50 \quad (7)$$

In the expression, vv1a is an Abbe number of the lens portion 1a, and v1b is an Abbe number of the lens portion 1b.

The expression (7) is a conditional expression to properly establish the Abbe number of the first lens block and to correct chromatic aberration satisfactorily. When a value of the expression (7) exceeds the lower limit, it is possible to restrain that axial chromatic aberration is corrected insufficiently. On the other hand, when a value of the expression (7) is lower than the upper limit, it is possible to restrain that axial chromatic aberration is corrected excessively.

Incidentally, the following conditional expression is more preferable.

$$15<v1a-v1b<40$$

In the above image pickup lens, each of the first lens substrate and the second lens substrate preferably comprises a glass material. A softening temperature of glass is higher than that of resin. A lens substrate made of glass hardly varies when reflow processing is added, and cost reduction can be attained. Further, it is more desirable if glass having higher softening temperature is used.

In the above image pickup lens, each of the lens portions 1a, 1b, 2a and 2b preferably comprises a resin material.

When all of the lens portions are made of resin material, moldability becomes better in comparison with an occasion of using a glass material, and cost reduction can be attained.

Further, it is more preferable that the resin material comprises a curable resin material.

By constituting all of the lens portions with a resin material of a curable type, it becomes possible to cure a large amount of lens portions simultaneously on a wafer-shaped lens substrate by means of a mold through various methods. Thereby, its mass productivity can be improved.

The curable resin material in this case includes a resin material that is cured by heat and a resin material that is cured by light. Meanwhile, it is desirable that the curable resin material is composed of a UV curing resin material. When employing a UV curing resin material, curing time can be shortened, and mass productivity can be improved. Furthermore, in recent years, there have been developed resins excellent in terms of heat resistance and curable resin materials, which can withstand reflow processing.

It is further preferable that inorganic microparticles of a size of 30 nanometers or less are dispersed in the resin material.

By dispersing the inorganic microparticles having a particle size of 30 nanometer or less in a lens portion that is composed of a resin material, it is possible to reduce deterioration of its property and to reduce fluctuations of an image point, even when a temperature is changed. It is further possible to offer an image pickup lens having an excellent optical property in spite of environmental changes, without lowering the light transmittance.

In general, if fine particles are mixed in a transparent resin material, light scatters therein and it causes lowered transmittance. Therefore, it was known that such material is difficult to use as an optical material. However, by making a size of microparticles to be smaller than a wavelength of a transmitting light flux, occurrence of light scattering can be prevented substantially.

Further, though it has been a drawback of resin material that its refractive index is lower than that of glass material, it has found that the refractive index can be made to be high, by dispersing inorganic particles having high refractive index in a resin material representing base material. Specifically, it is possible to offer the material having an arbitral refractive index, by dispersing inorganic particles of a size of 30 nanometer or less, preferably of 20 nanometer or less, more preferably 15 nanometer or less, into a plastic material serving as a base material.

The refractive index of a resin material is lowered if a temperature rises. However, when there are prepared inorganic particles whose refractive index rises if a temperature rises, and when the inorganic particles are dispersed in the resin material serving as a base material, properties of both parties act on each other to cancel, thus, fluctuations of refractive index for temperature changes can be made small. On the contrary, when there are prepared inorganic particles whose refractive index declines if a temperature rises, and when the inorganic particles are dispersed in the resin material serving as a base material, fluctuations of refractive index for temperature changes can be made to be large. Specifically, it is possible to offer materials having arbitral temperature-dependency, by dispersing inorganic particles of a particle size of 30 nanometer or less, preferably 20 nanometer or less, more preferably 15 nanometer or less, into a plastic material serving as a base material.

For example, when inorganic particles such as aluminum oxide ($Al_2O_3$) or lithium niobate ($LiNbO_3$) are dispersed in an acrylic resin, it is possible to obtain a plastic material having high refractive index and to make fluctuations of changes in refractive index for temperature changes to be small.

Next, refractive index change A due to temperature will be explained in detail. The refractive index change A due to temperature is expressed by the following expression (8) by differentiating a refractive index with respect to temperature t, based on the Lorentz-Lorenz equation.

$$A = \frac{(n^2+2)(n^2-1)}{6n}\left\{(-3\alpha) + \frac{1}{[R]}\frac{\partial [R]}{\partial t}\right\} \quad (8)$$

In the expression above, α represents the coefficient of linear expansion, and [R] represents molecular refraction.

In the case of resin materials, a contribution of the second term to the refractive index change is generally smaller than that of the first term in the expression, and it can be mostly neglected. For example, in the case of PMMA resins, coefficient of linear expansion α is $7\times10^{-5}$. When it is substituted in the aforesaid expression, $dn/dt=-1.2\times10^{-4}$ [/° C.] holds to agree generally with actual measurements.

In this case, by dispersing fine particles in a resin material, or by dispersing inorganic microparticles in a resin material desirably, the contribution of the second term in the aforesaid expression is made to be substantially large so that it may offset with a change by linear expansion of the first term each other. Specifically, it is desirable that the change which has been about $-1.2\times10^{-4}$ is controlled to be less than $8\times10^{-5}$ in an absolute value.

It is further possible to exhibit a temperature dependency which is opposite to that of a resin material representing a base material, by further increasing the contribution of the second term. In other words, it is also possible to obtain a raw material whose refractive index is raised rather than declined when temperature rises.

A mixing ratio of the particles can be varied properly for controlling a change rate of a refractive index for temperature, and it is also possible to disperse inorganic particles such that plural types of particles in nano-sizes are blended.

Another embodiment of the present invention is an image pickup apparatus comprising any one of the above image pickup lenses.

It can provide an image pickup apparatus with high performance in a lower cost.

The other embodiment of the present invention is a mobile terminal comprising the above image pickup apparatus.

It can provide a mobile terminal with high performance in a lower cost.

Further, an image pickup lens having the aforesaid structure can be manufactured by the following method: a plurality of lens substrates are joined by a spacer to be one body, where each of the plurality of lens substrates is a parallel flat plate, lens portions are arranged on an object side surface and an image side surface of each of the plurality of lens substrates, and the spacer is in a grid shape; and the plurality of lens substrates and the spacer which are joined in one body, are cut along a position of a grid of the spacer.

Image pickup lenses can be mass-produced in a reduced cost by the method.

According to these embodiments, it is possible to provide an image pickup lens, and an image pickup apparatus employing the image pickup lens, a mobile terminal employing the image pickup apparatus, and a manufacturing method of the image pickup lens. The image pickup lens can be an optical system with high heating resistance and less deterioration in terms of lens property caused by manufacturing errors, and such the image pickup lenses can be mass-produced as wafer-scale lenses. Further, compact image pickup lenses with excellent aberration property cane be produced at a low cost.

Figure 1:
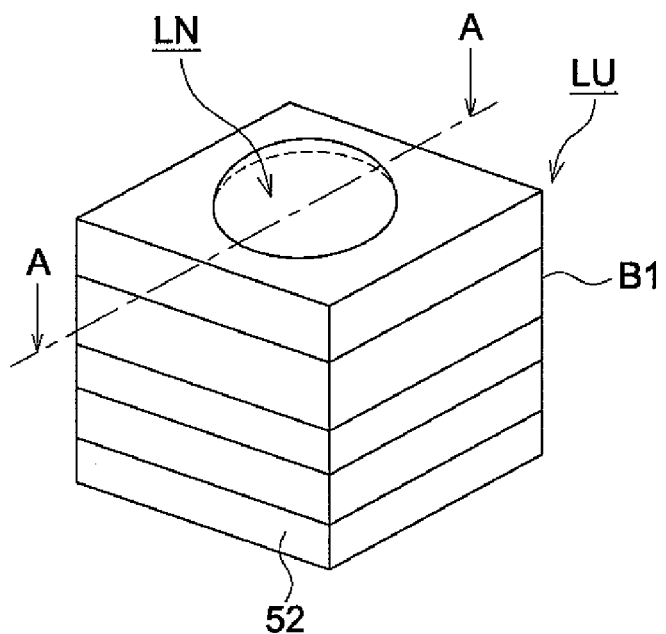
FIG. 1 is a perspective view of an image pickup apparatus in the present embodiment.

A preferred embodiment of the invention will be explained as follows, based on drawings. FIG. 1 is a perspective view of an image pickup apparatus, and FIG. 2 is a cross-sectional view of the structure shown in FIG. 1 which are taken on arrows A-A and are viewed in the direction of the arrows.

Figure 2:
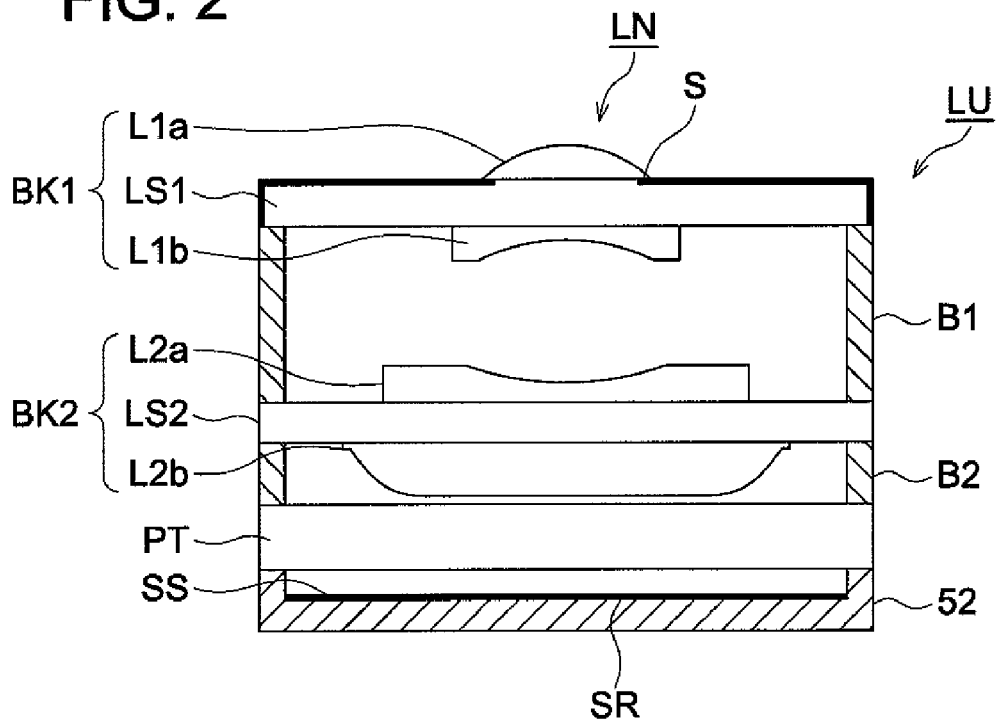
FIG. 2 is a cross-sectional view of the structure shown in FIG. 1 which is taken following arrows A-A and are viewed in the direction of the arrows.

As shown in FIG. 2, image pickup apparatus LU is equipped with image sensor SR of a CMOS type representing a solid-state image pickup element, image pickup lens LN and with substrate 52, which are formed in one body. The image sensor SR includes photoelectric converting surface SS thereon and the image pickup lens LN forms an image of a photographic object on the photoelectric converting surface SS. The substrate 52 holds the image sensor SR and includes an external connecting terminal (not shown) that conducts transmission and reception of electric signal. Incidentally, the image pickup lens LN includes first lens block BK1 and second lens block BK2 in this order from the object side (upper part in FIG. 2). The first lens blocks BK1 is constructed by put lens portions 1a and 1b (L1a, L1b) on opposing surfaces (the object side surface and the image side surface) of lens substrates LS1. The second lens blocks BK2 is constructed by put lens portions 2a and 2b (L2a, L2b) on opposing surfaces (the object side surface and the image side surface) of lens substrates LS2. Each of the lens portions has a positive power or negative power. Incidentally, "put on" means to adhere the surfaces of one of the lens substrates LS1 and LS2 and the lens portions directly, or to indirectly adhere them with interposition of another member.

The image sensor SR includes photoelectric converting surface SS representing a light-receiving section on the central portion of a plane surface on the light-receiving side of the image sensor SR. On the photoelectric converting surface SS, pixels (a photoelectric converting element) are arranged on a two-dimensional basis. The photoelectric converting section is connected to an unillustrated signal processing circuit. The signal processing circuit of this kind is composed of a drive circuit that obtains signal electric charges by driving respective pixels in succession, A/D converting section that converts each signal electric charge into digital signal and of a signal processing section that forms an output of image signal by using the digital signal. Further, many pads (not shown) are arranged in the vicinity of an outer edge of the plane surface on the light-receiving side of the image sensor SR, and they are connected to substrate 52 through an unillustrated wire. The image sensor SR converts signal electric charges coming from photoelectric converting surface SS into image signal such as digital YUV signal, and outputs the signal to a prescribed circuit on the substrate 52 through a wire (not shown). In this case, Y represents a luminance signal, U(=R−Y) represents color difference signal between red signal and a luminance signal and V (=B−Y) represents color difference signal between blue signal and a luminance signal. Meanwhile, the imaging sensor SR is not limited to an image sensor of a CMOS type, and others such as CCD or the like can be used.

Substrate 52 that supports the image sensor SR is connected to be capable of communicating with the image sensor SR.

The substrate 52 is connected to an external circuit (for example, a control circuit provided on a mobile terminal on which an image pickup apparatus is mounted) through the unillustrated external connecting terminal, to make it possible to receive the supply of voltage for driving image sensor SR from an external circuit and of clock signal, and to output digital YUV signal to external circuits.

An upper portion of the image sensor SR is sealed by parallel flat plate PT such as an infrared blocking filter fixed on the upper surface of the substrate 52. On the upper surface of the parallel flat plate PT, there is fixed a bottom edge of spacer member B2. Further, the second lens block BK2 is fixed on an upper edge of the spacer member B2, a bottom edge of another spacer member B1 is fixed on the upper surface of the second lens block BK2 and the first lens block BK1 is fixed on an upper edge of the spacer member B1.

The first lens block BK1 is composed of first lens substrate LS1 that is made of glass and is a parallel flat plate, and of lens portions 1a and 1b (L1a and L1b, in FIG. 2) that are made of plastic and are adhered respectively on the object side and on the image side of the first lens substrate. The second lens block BK2 is composed of the second lens substrate LS2 that is made of glass and is a parallel flat plate, and of lens portions 2a and 2b (L2a and L2b, in FIG. 2) that are made of resin and are adhered respectively on the object side and on the image side of the second lens substrate. The first lens block BK1 has positive refractive power, and the second lens block BK2 has negative refractive power. The first lens substrate LS1 is different from lens portions 1a and 1b (L1a, L1b) in terms of at least one of a refractive index and Abbe number. The second lens substrate LS2 is different from lens portions 2a and 2b (L2a, L2b) in terms of at least one of a refractive index and Abbe number.

In the first lens block BK1, lens portion 1a (L1a) is formed on the object side surface of the first lens substrate LS1, and the object side surface of the lens portion 1a (L1a) has a form of convex surface facing the object side. Further, lens portion 1b (L1b) is formed on the image side surface of the first lens substrate LS1, and the image side surface of the lens portion 1b (L1b) has a form of a concave surface facing the image side.

In the second lens block BK2, lens portion 2a (L2a) is formed on the object side surface of the second lens substrate LS2, and the object side surface of the lens portion 2a (L2a) has a form of a concave surface facing the object side. Lens portion 2b (L2b) is formed on the image side surface of the second lens substrate LS2.

Aperture stop S is formed on the object side surface of the first lens substrate LS1 in the first block BK1.

In the structure, at least one of the lens portions (L1a, L1b, L2a, L2b) is preferably formed of a UV-curable resin in which inorganic fine particles whose maximum size is 30 nanometers or less are dispersed.

The image pickup apparatus can be used for various cameras such as a digital camera, a video camera, a security camera, an on-vehicle camera and a video phone camera. Further, such the cameras may also be built in or be attached on a personal computer, a mobile terminal (for example, a compact and portable information equipment terminal such as a cell-phone and a mobile computer), a peripheral of the aforesaid equipment (a scanner and a printer or the like) and other digital equipment.

Figure 3:
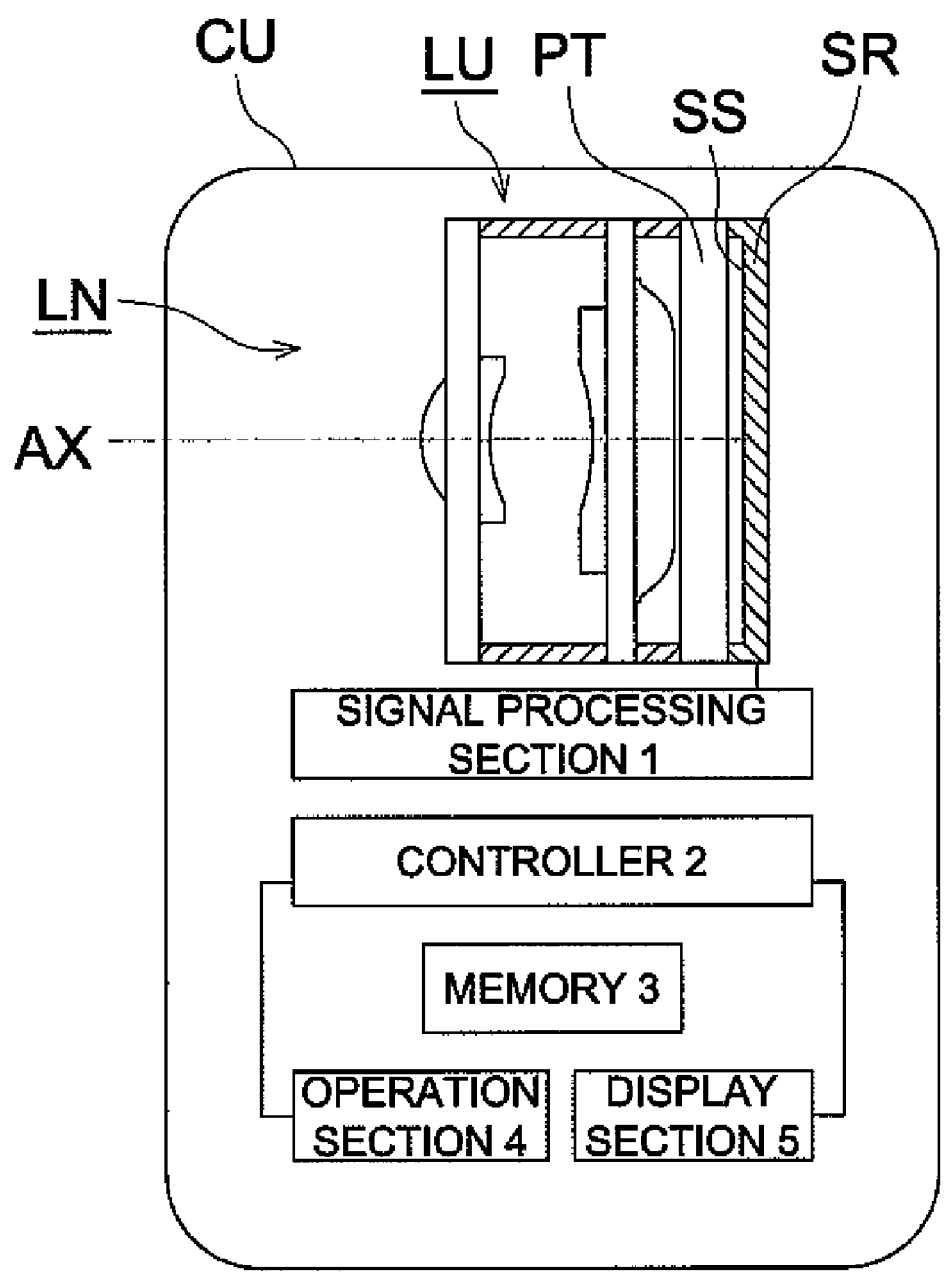
FIG. 3 is a diagram showing the state where the image pickup apparatus is mounted on a mobile terminal.

FIG. 3 is a block diagram of mobile terminal CU that is an example of a digital equipment having an image inputting function. Image pickup apparatus LU loaded in the mobile terminal CU in FIG. 3 includes image pickup lens LN, parallel flat plate PT and image sensor SR.

The image pickup lens LN forms an optical image of an object on photoelectric converting surface SS. The optical image passes through, for example, the parallel flat plate PT as an optical lowpass filter having prescribed cut-off frequency characteristic determined by a pixel pitch of image pickup element SR. Its spatial frequency characteristic is adjusted so that a so-called folding noise generated when an image is converted into electric signal may be minimized after this passage.

Then, occurrence of color moiré is controlled by this adjustment of the spatial frequency characteristic. However, if performances at a frequency around the resolution limit has been controlled, noises are not generated even when an optical lowpass filter is not used. Further, when a user takes or views a photograph by using a display system having a less noise (for example, a liquid crystal screen of a cell-phone), no optical lowpass filter is needed.

The parallel flat plate PT is an optical filter arranged in case of need, such as an optical lowpass filter and an infrared blocking filter. Incidentally, the parallel flat plate PT sometimes corresponds to a cover glass of image sensor SR.

The image sensor SR converts the optical image which is formed on the photoelectric converting surface SS by image pickup lens LN, into electric signal. For example, as the image sensor SR, there are given an image sensor of a CCD (charge Coupled Device) type and an image sensor of a CMOS (Complementary Metal-Oxide Semiconductor) type each having a plurality of pixels thereon. Meanwhile, the image pickup lens LN is positioned so that an optical image of a photographic subject may be formed on the photoelectric converting surface SS of the image sensor SR. Therefore, the optical images formed by the image pickup lens LN are converted efficiently into electric signal.

When image pickup apparatus LU of this kind is loaded in mobile terminal CU having image inputting functions, image pickup apparatus LU is generally arranged in the inside of a body of the mobile terminal CU. Alternatively, the image pickup apparatus LU may be formed into a unit component to be mounted on or dismounted from a main body of mobile terminal CU freely, or to be rotatably arranged on a main body of mobile terminal CU.

The mobile terminal CU includes signal processing section 1, controller 2, memory 3, operation section 4 and display section 5, in addition to the image pickup apparatus LU.

The signal processing section 1 conducts, for example, prescribed digital image processing and image compression processing, for signal generated by image sensor SR, as occasion demands. Then, the processed signal is stored as digital image signal in memory 3 including a device such as a semiconductor memory and an optical disc, or are converted into infrared radiation signal through cables to be transmitted to other equipment.

The controller 2 is a microcomputer which conducts intensively function control for image pickup function and image reproducing function. For example, the controller 2 controls image pickup apparatus LU so that at least one of shooting still images of a photographic subject and shooting video of a photographic subject may be conducted.

The memory 3 stores, for example, signal which has been generated by image pickup element SR and have been processed by signal processing section 1.

The operation section 4 is a portion including operating members such as an operation button (for example, a release button) and an operation dial (for example, a photographing mode dial), and it transmits information operated and inputted by an operator to the controller 2.

The display section 5 is a portion including a display such as a liquid crystal monitor, and it displays images by using image signal converted by image sensor SR or by using image information recorded in memory 3.

A manufacturing method for image pickup lens LN will be explained as follows.

Lens block unit UT is manufactured, for example, by a reflow method or replica method that can manufacture many lens blocks simultaneously, as shown in a cross-sectional view in FIG. 4a. Incidentally, the number of lens blocks BK included in lens block unit UT may either be single or be plural.

In the reflow method, glass having a low softening temperature is deposited on a glass substrate through a CVD (Chemical Vapor Deposition) method. Then, the deposited low softening temperature glass is processed through lithography and through dry etching. Furthermore, the deposited low softening temperature glass is melted by further heating to become a shape of lenses. In other words, many lenses are manufactured simultaneously on the glass substrate in this reflow method.

In the replica method, curable resin material is transferred on a glass substrate to form a lens shape with a mold. Owing to this, many lenses are manufactured simultaneously on a glass substrate in the replica method.

Then, image pickup lenses LN are manufactured from the lens block units UT that are manufactured by the aforesaid methods. An example of the manufacturing process for the image pickup lenses is shown on a schematic sectional diagram in FIG. 4b.

The first lens block unit UT1 is composed of first lens substrate LS1 which is formed in a parallel flat plate, lens portions 1a (L1a) adhered to a plane on one side of the first lens substrate LS1 and of lens portions 1b (L1b) adhered to a plane on the other side.

The second lens block unit UT2 is composed of second lens substrate LS2 which is formed in a parallel flat plate, lens portions 2a (L2a) adhered to a plane on one side of the second lens substrate LS2 and of lens portions 2b (L2b) adhered to a plane on the other side.

A spacer member (spacer) B1 in a grid shape lies between the first lens block unit UT1 and the second lens block unit UT2 (specifically, between the first lens substrate LS1 and the second lens substrate LS2). The lens block units UT1 and UT2 are joined with the spacer member to keep a distance between the lens block units UT1 and UT2 to be constant. Further, spacer member B2 lies between parallel flat plate PT and the second lens block unit UT2. The parallel flat plate PT and the second lens block unit UT2 are joined with the spacer member to keep a distance between parallel flat plate PT and lens block unit UT2 to be constant. In other words, spacer members B1 and B2 can be said a two-step lattice. Then, respective lens portions 1a, 1b, 2a and 2b (L1a, L1b, L2a, and L2b) are located at corresponding to holes of the grid of spacer members B1 and B2.

Meanwhile, parallel flat plate PT is a wafer-level chip-size package for a sensor including a microlens array, or a parallel flat plate such as a sensor cover glass or an infrared blocking filter.

When the first lens block unit UT1 and the second lens block unit UT2 are connected with spacer member B1, and when the second lens unit UT2 and the parallel flat plate PT are connected by spacer member B2, the first lens substrate LS1 and second lens substrate LS2 are joined in one body with the space around the lens substrates sealed.

Then, a body in which the first lens substrate LS1 and the second lens substrate LS2, the spacer members B1 and B2, and the parallel flat plate PT are joined together, are cut up along a position shown with broken lines on the grid frames of the spacer members B1 and B2. After that, a plurality of image pickup lenses LN each being of a two-element structure are obtained as shown in FIG. 4c.

As stated above, when a member wherein the first lens block BK1 and second lens block BK2 are incorporated is cut off, image pickup lens LN can be manufactured. Thus, adjustment for a lens distance and assembling of lenses for each image pickup lens LN are not needed, which makes mass production of image pickup lenses LN possible.

In addition, each of spacer members B1 and 32 is in a grid form. Therefore, each of spacer members S1 and B2 are also served as a mark for cutting image pickup lenses LN out from the integrated member in which plural lens blocks BK1 and BK2 are incorporated. Therefore, image pickup lens LN can be easily cut out from the integrated member, which is not time-consuming. As a result, image pickup lenses can be manufactured at low cost on a mass production basis.

When the foregoing is considered, the manufacturing method for image pickup lens LN includes a joining process to join plural lens block units UT1 and UT2 by spacer member B1 by arranging spacer member B1 to touch with at least a part of the fringes of lens blocks BK1 and BK2, and a cutting process to cut the joined lens block units UT1 and UT2 along the spacer member B1. Such the manufacturing method is suitable for mass production of inexpensive lens systems.

In the present embodiment, the image pickup lens is not necessarily designed such that a telecentricity of a light flux at the image side is sufficiently achieved. In the recent technology, it has become possible to reduce shading on a solid-state image pickup element by a revision of an arrangement of a color filter and a microlens array of a solid-state image pickup element. In the periphery of an image pickup surface, an angle formed between the principal ray and the optical axis preferably satisfies the conditional expression (9). There has actually been developed an image pickup element which does not exhibit a remarkable shading within the conditional expression. In the present embodiment, the image pickup lens can be designed such that a requirement about the telecentricity is lighten because of the merit of the above image pickup element and aberrations are corrected in more excellent condition, whereby a wafer-scale lens suitable for mass production is realized while sufficiently coping with a solid-state image pickup element with the larger number of pixels.

$$25° < \omega < 35° \quad (9)$$

In the expression, $\omega$ is an angle formed between the optical axis and a principal ray at the maximum image height entering an image pickup surface of an image pickup element.

EXAMPLES

Examples suitable to the above embodiments will be shown below. However, the scope of the invention is not limited to the following examples. Symbols used in each Example are as follows:

f: focal length of the total system of the image pickup lens
fB: back focus
F: F number
2Y: Diagonal length of an image pickup surface of a solid-state image pickup element (Diagonal length on rectangular effective pixel area of a solid-state image pickup element)
ENTP: Entrance pupil position (Distance from the first surface to the entrance pupil position)
EXTP: Emergence pupil position (Distance from an image plane to the emergence pupil position)

H1: Front side principal point position (Distance from the first surface to the front side principal point position)

H2: Rear side principal point position (Distance from the last surface to the rear side principal point position)

R: Curvature radius of a refractive surface

D: Surface distance on the optical axis

Nd: Refractive index of lens material at normal temperature at d line vd: Abbe number of lens material Asterisk (*): aspheric surface As for a focal length of the each lens portion, a lens portion formed on the object side surface of the lens substrate provides a focal length in case that the object side and image side of the lens are filled with the air. Meanwhile, a lens portion formed on the image side surface of the lens substrate provides a focal length in case that the object side and image side of the lens is filled with the air.

In each Example, a shape of an aspheric surface is expressed by the following expression (10), where X-axis extends along the optical axis direction, the top of the surface is on the origin, and the height perpendicular to the optical axis is h.

$$X = \frac{h^2/R}{1 + \sqrt{1 - (1+K)h^2/R^2}} + \sum A_i h^i \quad (10)$$

In the aforesaid expression, Ai represents $i^{th}$ order aspheric surface coefficient, R represents a curvature radius and K represents a conic constant.

In the following description (including lens data in Tables), an exponent for 10 is assumed to be expressed by using E (for example, 2.5×10−02 is expressed by 2.5E−02). Further, surface numbers in lens data are numbered by assuming the surface of the first lens facing the object as the first surface. Incidentally, each of all units of numerical values indicating lengths described in the Examples is mm.

Example 1

Lens data of Example 1 are shown in Table 1.

TABLE 1 f = 2.98 mm, fB = 0.16 mm, F = 2.8, 2Y = 3.5 mm,
ENTP = 0.22 mm, EXTP = −1.80 mm,
H1 = −1.33 mm, H2 = −2.82 mm

| Surface No. | R (mm) | D (mm) | Nd | vd | Effective radius (mm) |
|---|---|---|---|---|---|
| 1(*) | 0.825 | 0.30 | 1.513 | 55 | 0.56 |
| 2 (Diaphragm) | ∞ | 0.39 | 1.470 | 65 | 0.51 |
| 3 | ∞ | 0.07 | 1.590 | 30 | 0.50 |
| 4(*) | 2.307 | 0.41 | | | 0.50 |
| 5(*) | −2.856 | 0.14 | 1.570 | 35 | 0.58 |
| 6 | ∞ | 0.69 | 1.470 | 65 | 0.78 |
| 7 | ∞ | 0.49 | 1.570 | 35 | 1.31 |
| 8(*) | 9.805 | 0.10 | | | 1.39 |
| 9 | ∞ | 0.50 | 1.516 | 64 | 1.59 |
| 10 | ∞ | 0.16 | | | 1.71 |

Aspheric Surface Coefficient $1^{st}$ Surface

K = 0.24110E−01
A4 = −0.76992E−02
A6 = 0.22116E+00

TABLE 1-continued f = 2.98 mm, fB = 0.16 mm, F = 2.8, 2Y = 3.5 mm,
ENTP = 0.22 mm, EXTP = −1.80 mm,
H1 = −1.33 mm, H2 = −2.82 mm A8 = −0.89518E+00
A10 = 0.76286E−01
A12 = 0.12557E+01
A14 = 0.14692E+02
A16 = −0.81966E+01
A18 = −0.47815E+02
A20 = −0.10647E+02

$4^{th}$ Surface

K = 0.11699E+02
A4 = 0.15488E+00
A6 = −0.22486E+00
A8 = 0.54011E+00
A10 = 0.94165E+01
A12 = −0.19387E+02
A14 = 0.61351E+02
A16 = 0.85443E+02
A18 = −0.55073E+02
A20 = −0.34318E+03

$5^{th}$ Surface

K = −0.15936E+01
A4 = −0.57846E+00
A6 = 0.89746E+00
A8 = −0.66050E+01
A10 = 0.11481E+02
A12 = −0.58783E+01
A14 = −0.58713E+02
A16 = 0.12287E+03
A18 = 0.15861E+03
A20 = −0.85648E+03

$8^{th}$ Surface

K = 0.16404E+02
A4 = −0.81453E−01
A6 = −0.24477E−01
A8 = −0.78141E−02
A10 = 0.18887E−01
A12 = −0.84156E−02
A14 = −0.28156E−02
A16 = 0.13636E−02
A18 = 0.66819E−03
A20 = −0.26160E−03

Lens Block Data

| Lens block | Starting surface | End surface | Focal length (mm) |
|---|---|---|---|
| 1 | 1 | 4 | 2.24 |
| 2 | 5 | 8 | −3.73 |

Values corresponding to respective conditional expressions are shown below.

N2b=1.570

D[BK2]/D[BK1]=1.74

N1b=1.590

N2a=1.570

|f1/f2|=0.60 f1b/f1=−1.75 v1a−v1b=25.0

ω=26.5°

FIG. 5 is a cross-sectional view of a lens in Example 1. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate LS2, and of lens portion 2b (L2b) that is concave facing the image side, in this order from the object side. The flat parallel plate PT corresponds to an optical element such as an optical lowpass filter, an infrared blocking filter and a sealing glass of solid-state image pickup element. In addition, all surfaces of lens portions which touch with the air are in a form of an aspheric surface. The first lens block BK1 has positive refractive power, while the second lens block BK2 has negative refractive power.

FIG. 6 is a diagram showing aberrations of an image pickup lens in Example 1 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Example 2

Lens data of Example 2 are shown in Table 2.

TABLE 2 f = 2.93 mm, fB = 0.07 mm, F = 2.78, 2Y = 3.5 mm,
ENTP = 0.57 mm, EXTP = −1.75 mm,
H1 = −1.22 mm, H2 = −2.86 mm

| Surface No. | R (mm) | D (mm) | Nd | νd | Effective radius (mm) |
|---|---|---|---|---|---|
| 1(*) | 0.783 | 0.33 | 1.518 | 57 | 0.57 |
| 2 | ∞ | 0.30 | 1.520 | 62 | 0.52 |
| 3 (Diaphragm) | ∞ | 0.06 | 1.572 | 35 | 0.40 |
| 4(*) | 1.814 | 0.35 | | | 0.44 |
| 5(*) | −3.460 | 0.11 | 1.572 | 35 | 0.57 |
| 6 | ∞ | 1.10 | 1.520 | 62 | 0.69 |
| 7 | ∞ | 0.41 | 1.572 | 35 | 1.37 |
| 8(*) | 9.576 | 0.10 | | | 1.45 |
| 9 | ∞ | 0.50 | 1.470 | 65 | 1.60 |
| 10 | ∞ | 0.07 | | | 1.72 |

Aspheric Surface Coefficient $1^{st}$ Surface

K = −0.30420E+00
A4 = 0.61331E−01
A6 = 0.52666E+00
A8 = −0.63008E+00
A10 = −0.56268E+00
A12 = 0.60414E+01

$4^{th}$ Surface

K = 0.50116E+01
A4 = 0.30772E+00
A6 = −0.15497E+01
A8 = 0.25529E+02
A10 = −0.11225E+03
A12 = 0.26608E+03

$5^{th}$ Surface

K = −0.13614E+02
A4 = −0.60570E+00
A6 = 0.12820E+01
A8 = −0.13122E+02
A10 = 0.12116E+03

TABLE 2-continued f = 2.93 mm, fB = 0.07 mm, F = 2.78, 2Y = 3.5 mm,
ENTP = 0.57 mm, EXTP = −1.75 mm,
H1 = −1.22 mm, H2 = −2.86 mm

A12 = −0.63267E+03
A14 = 0.15551E+04
A16 = −0.13862E+04

$8^{th}$ Surface

K = 0.24104E+02
A4 = −0.10090E+00
A6 = 0.16931E+00
A8 = −0.40779E+00
A10 = 0.45346E+00
A12 = −0.26769E+00
A14 = 0.80614E−01
A16 = −0.97410E−02
A18 = −0.14146E−05

Lens Block Data

| Lens block | Starting surface | End surface | Focal length (mm) |
|---|---|---|---|
| 1 | 1 | 4 | 2.27 |
| 2 | 5 | 8 | −4.25 |

Values corresponding to respective conditional expressions are shown below.

N2b=1.572

D[BK2]/D[BK1]=2.33

N1b=1.572

N2a=1.572

|f1/f2|=0.53 f1b/f1=−1.40

ν1a−ν1b=22.0

ω=30.1°

FIG. 7 is a cross-sectional view of a lens in Example 2. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate L32, and of lens portion 2b (L2b) that is concave facing the image side, in this order from the object side. The flat parallel plate PT corresponds to an optical element such as an optical lowpass filter, an infrared blocking filter and a sealing glass of solid-state imaging device. In addition, all surfaces of lens portions which touch with the air are in a form of an aspheric surface. The first lens block BK1 has positive refractive power, while the second lens block BK2 has negative refractive power.

FIG. 8 is a diagram showing aberrations of an image pickup lens in Example 2 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Example 3

Lens data of Example 3 are shown in Table 3.

TABLE 3 f = 3.04 mm, fB = 0.16 mm, F = 2.88, 2Y = 3.5 mm,
ENTP = 0.18 mm, EXTP = −1.84 mm,
H1 = −1.39 mm, H2 = −2.88 mm

| Surface No. | R (mm) | D (mm) | Nd | vd | Effective radius (mm) |
|---|---|---|---|---|---|
| 1(*) | 0.845 | 0.25 | 1.513 | 55 | 0.55 |
| 2 | ∞ | 0.30 | 1.470 | 65 | 0.51 |
| 3 (Diaphragm) | ∞ | 0.17 | 1.610 | 29 | 0.50 |
| 4(*) | 2.231 | 0.49 | | | 0.50 |
| 5(*) | −4.276 | 0.17 | 1.572 | 35 | 0.63 |
| 6 | ∞ | 0.88 | 1.470 | 65 | 0.81 |
| 7 | ∞ | 0.33 | 1.700 | 36 | 1.39 |
| 8(*) | 8.194 | 0.10 | | | 1.46 |
| 9 | ∞ | 0.50 | 1.516 | 64 | 1.58 |
| 10 | ∞ | 0.16 | | | 1.70 |

Aspheric Surface Coefficient $1^{st}$ Surface

K = −0.18642E−01
A4 = 0.42482E−01
A6 = −0.11195E+00
A8 = 0.13865E+01
A10 = −0.52066E+01
A12 = 0.89294E+01

$4^{th}$ Surface

K = 0.27654E+01
A4 = 0.31830E−01
A6 = 0.42787E+01
A8 = −0.33891E+02
A10 = 0.14295E+03
A12 = −0.18868E+03

$5^{th}$ Surface

K = −0.16316E+02
A4 = −0.58738E+00
A6 = 0.23546E+01
A8 = −0.14449E+02
A10 = 0.34800E+02
A12 = −0.29702E+02

$8^{th}$ Surface

K = 0.14622E+02
A4 = −0.10712E+00
A6 = 0.22395E+00
A8 = −0.44303E+00
A10 = 0.42658E+00
A12 = −0.22276E+00
A14 = 0.60414E−01
A16 = −0.66804E−02

Lens Block Data

| Lens block | Starting surface | Ending surface | Focal length (mm) |
|---|---|---|---|
| 1 | 1 | 4 | 2.42 |
| 2 | 5 | 8 | −4.36 |

Values corresponding to respective conditional expressions are shown below.

N2b=1.700

D[BK2]/D[BK1]=1.90

N1b=1.610

N2a=1.572

$|f1/f2|=0.56$ $f1b/f1=-1.51$ $v1a-v1b=26.0$ $\omega=26.8°$

FIG. 9 is a cross-sectional view of a lens in Example 3. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate LS2, and of lens portion 2b (L2b) that is concave facing the image side, in this order from the object side. The flat parallel plate PT corresponds to an optical element such as an optical lowpass filter, an infrared blocking filter and a sealing glass of solid-state imaging device. In addition, all surfaces of lens portions which touch with the air are in a form of an aspheric surface. The first lens block BK1 has positive refractive power, while the second lens block BK2 has negative refractive power.

FIG. 10 is a diagram showing aberrations of an image pickup lens in Example 3 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Example 4

Lens data of Example 4 are shown in Table 4.

TABLE 4 f = 2.91 mm, fB = 0.09 mm, F = 2.88, 2Y = 3.5 mm
ENTP = 0.53 mm, EXTP = −1.72 mm,
H1 = −1.24 mm, H2 = −2.82 mm

| Surface No. | R (mm) | D (mm) | Nd | vd | Effective radius (mm) |
|---|---|---|---|---|---|
| 1(*) | 0.764 | 0.29 | 1.518 | 57 | 0.54 |
| 2 | ∞ | 0.30 | 1.520 | 62 | 0.51 |
| 3 (Diaphragm) | ∞ | 0.15 | 1.572 | 35 | 0.39 |
| 4(*) | 2.082 | 0.29 | | | 0.42 |
| 5(*) | −2.130 | 0.05 | 1.572 | 35 | 0.48 |
| 6 | ∞ | 1.10 | 1.470 | 65 | 0.59 |
| 7 | ∞ | 0.37 | 1.572 | 35 | 1.39 |
| 8(*) | 16.027 | 0.10 | | | 1.42 |
| 9 | ∞ | 0.50 | 1.520 | 62 | 1.59 |
| 10 | ∞ | 0.09 | | | 1.71 |

TABLE 4-continued f = 2.91 mm, fB = 0.09 mm, F = 2.88, 2Y = 3.5 mm
ENTP = 0.53 mm, EXTP = −1.72 mm,
H1 = −1.24 mm, H2 = −2.82 mm Aspheric Surface Coefficient $1^{st}$ Surface K = −0.27812E+00
A4 = 0.44933E−01
A6 = 0.13479E+01
A8 = −0.10003E+02
A10 = 0.36674E+02
A12 = −0.44976E+02

$4^{th}$ Surface

K = 0.12388E+02
A4 = 0.19713E−01
A6 = −0.38863E+00
A8 = 0.14672E+02
A10 = −0.99560E+02
A12 = 0.28271E+03

$5^{th}$ Surface

K = 0.85615E+01
A4 = −0.11599E+01
A6 = 0.12979E+02
A8 = −0.14421E+03
A10 = 0.83342E+03
A12 = −0.26345E+04
A14 = 0.36490E+04
A16 = −0.13746E+04

$8^{th}$ Surface

K = −0.15883E+02
A4 = −0.12148E+00
A6 = 0.17573E+00
A8 = −0.30311E+00
A10 = 0.29327E+00
A12 = −0.18251E+00
A14 = 0.70244E−01
A16 = −0.15061E−01
A18 = 0.13546E−02

Lens Block Data

| Lens block | Starting surface | End surface | Focal length (mm) |
|---|---|---|---|
| 1 | 1 | 4 | 2.03 |
| 2 | 5 | 8 | −3.18 |

Values corresponding to respective conditional expressions are shown below.

N2b=1.572

D[BK2]/D[BK1]=2.06

N1b=1.572

N2a=1.572

|f1/f2|=0.64 f1b/f1=−1.79

ν1a−ν1b=22.0

ω=29.2°

FIG. 11 is a cross-sectional view of a lens in Example 4. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate LS2, and of lens portion 2b (L2b) that is concave facing the image side, in this order from the object side. The flat parallel plate PT corresponds to an optical element such as an optical lowpass filter, an infrared blocking filter and a sealing glass of solid-state imaging device. In addition, all surfaces of lens portions which touch with the air are in a form of an aspheric surface. The first lens block BK1 has positive refractive power, while the second lens block BK2 has negative refractive power.

FIG. 12 is a diagram showing aberrations of an image pickup lens in Example 4 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Example 5

Lens data of Example 5 are shown in Table 5.

TABLE 5 f = 2.94 mm, fB = 0.04 mm, F = 2.88, 2Y = 3.5 mm
ENTP = 0.19 mm, EXTP = −1.92 mm,
H1 = −1.27 mm, H2 = −2.89 mm

| Surface No. | R (mm) | D (mm) | Nd | νd | Effective radius (mm) |
|---|---|---|---|---|---|
| 1(*) | 0.772 | 0.26 | 1.518 | 57 | 0.53 |
| 2 (Diaphragm) | ∞ | 0.30 | 1.520 | 62 | 0.50 |
| 3 | ∞ | 0.18 | 1.572 | 35 | 0.46 |
| 4(*) | 1.964 | 0.33 | | | 0.46 |
| 5(*) | −2.409 | 0.05 | 1.572 | 35 | 0.53 |
| 6 | ∞ | 1.01 | 1.520 | 62 | 0.64 |
| 7 | ∞ | 0.37 | 1.572 | 35 | 1.30 |
| 8(*) | 13.310 | 0.21 | | | 1.36 |
| 9 | ∞ | 0.50 | 1.520 | 62 | 1.52 |
| 10 | ∞ | 0.04 | | | 1.67 |

Aspheric Surface Coefficient $1^{st}$ Surface

K = −0.29864E+00
A4 = 0.11772E+00
A6 = 0.11333E+00
A8 = −0.45803E+00
A10 = 0.37231E+01
A12 = −0.29140E+01

$4^{th}$ Surface

K = 0.41513E+01
A4 = 0.39318E+00
A6 = −0.30403E+01
A8 = 0.34548E+02
A10 = −0.13264E+03
A12 = 0.26603E+03

$5^{th}$ Surface

K = −0.27171E+01
A4 = −0.83372E+00
A6 = 0.31821E+01
A8 = −0.25675E+02
A10 = 0.13876E+03
A12 = −0.63270E+03
A14 = 0.15551E+04
A16 = −0.13863E+04

TABLE 5-continued f = 2.94 mm, fB = 0.04 mm, F = 2.88, 2Y = 3.5 mm
ENTP = 0.19 mm, EXTP = −1.92 mm,
H1 = −1.27 mm, H2 = −2.89 mm $8^{th}$ Surface K = −0.30000E+02
A4 = −0.15104E+00
A6 = 0.25691E+00
A8 = −0.44049E+00
A10 = 0.42368E+00
A12 = −0.24923E+00
A14 = 0.87936E−01
A16 = −0.17314E−01
A18 = 0.14873E−02

Lens Block Data

| Lens block | Starting surface | End surface | Focal length (mm) |
|---|---|---|---|
| 1 | 1 | 4 | 2.11 |
| 2 | 5 | 8 | −3.45 |

Values corresponding to respective conditional expressions are shown below.

N2b=1.572

D[BK2]/D[BK1]=1.94

N1b=1.572

N2a=1.572

|f1/f2|=0.61 f1b/f1=−1.63

ν1a−ν1b=22.0

ω=29.2°

FIG. 13 is a cross-sectional view of a lens in Example 5. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate LS2, and of lens portion 2b (L2b) that is concave facing the image side, in this order from the object side. The flat parallel plate PT corresponds to an optical element such as an optical lowpass filter, an infrared blocking filter and a sealing glass of solid-state imaging device. In addition, all surfaces of lens portions which touch with the air are in a form of an aspheric surface. The first lens block BK1 has positive refractive power, while the second lens block BK2 has negative refractive power.

FIG. 14 is a diagram showing aberrations of an image pickup lens in Example 5 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Example 6

Lens data of Example 6 are shown in Table 6.

TABLE 6 f = 2.98 mm, fB = 0.14 mm, F = 2.88, 2Y = 3.5 mm,
ENTP = 0.22 mm, EXTP = −1.89 mm,
H1 = −1.18 mm, H2 = −2.85 mm

| Surface No. | R (mm) | D (mm) | Nd | νd | Effective radius (mm) |
|---|---|---|---|---|---|
| 1(*) | 0.785 | 0.29 | 1.516 | 56 | 0.54 |
| 2 | ∞ | 0.30 | 1.470 | 65 | 0.49 |
| (Diaphragm) | | | | | |
| 3 | ∞ | 0.07 | 1.572 | 35 | 0.48 |
| 4(*) | 1.827 | 0.40 | | | 0.48 |
| 5(*) | −3.354 | 0.22 | 1.572 | 35 | 0.59 |
| 6 | ∞ | 0.92 | 1.470 | 65 | 0.80 |
| 7 | ∞ | 0.35 | 1.572 | 35 | 1.41 |
| 8(*) | 11.944 | 0.10 | | | 1.43 |
| 9 | ∞ | 0.50 | 1.470 | 65 | 1.58 |
| 10 | ∞ | 0.14 | | | 1.70 |

Aspheric Surface Coefficient $1^{st}$ Surface

K = −0.28528E+00
A4 = 0.12187E+00
A6 = 0.14697E+00
A8 = 0.59332E−02
A10 = 0.54632E+00
A12 = 0.31485E+01

$4^{th}$ Surface

K = 0.49196E+01
A4 = 0.24976E+00
A6 = −0.74834E+00
A8 = 0.19326E+02
A10 = −0.10302E+03
A12 = 0.27844E+03

$5^{th}$ Surface

K = −0.96523E+01
A4 = −0.55169E+00
A6 = −0.63773E+00
A8 = 0.11814E+02
A10 = −0.58025E+02
A12 = 0.84661E+02

$8^{th}$ Surface

K = −0.15316E+01
A4 = −0.11691E+00
A6 = 0.18705E+00
A8 = −0.41224E+00
A10 = 0.45266E+00
A12 = −0.26727E+00
A14 = 0.80749E−01
A16 = −0.98489E−02

Lens Block Data

| Lens block | Starting surface | End surface | Focal length (mm) |
|---|---|---|---|
| 1 | 1 | 4 | 2.30 |
| 2 | 5 | 8 | −4.41 |

Values corresponding to respective conditional expressions are shown below.

N2b=1.572

D[BK2]/D[BK1]=2.24

N1b=1.572

N2a=1.572

$|f1/f2|=0.52$ $f1b/f1=-1.39$ $v1a-v1b=21.0$ $\omega=27.2°$

FIG. 15 is a cross-sectional view of a lens in Example 6. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate LS2, and of lens portion 2b (L2b) that is concave facing the image side, in this order from the object side. The flat parallel plate PT corresponds to an optical element such as an optical lowpass filter, an infrared blocking filter and a sealing glass of solid-state imaging device. In addition, all surfaces of lens portions which touch with the air are in a form of an aspheric surface. The first lens block BK1 has positive refractive power, while the second lens block BK2 has negative refractive power.

FIG. 16 is a diagram showing aberrations of an image pickup lens in Example 6 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Example 7

Lens data of Example 7 are shown in Table 7.

TABLE 7 f = 3.09 mm, fB = 0.23 mm, F = 2.88, 2Y = 3.5 mm,
ENTP = 0.24 mm, EXTP = −1.91 mm,
H1 = −1.13 mm, H2 = −2.86 mm

| Surface No. | R (mm) | D (mm) | Nd | vd | Effective radius (mm) |
|---|---|---|---|---|---|
| 1(*) | 0.834 | 0.32 | 1.513 | 55 | 0.56 |
| 2 (Diaphragm) | ∞ | 0.38 | 1.470 | 65 | 0.50 |
| 3 | ∞ | 0.08 | 1.610 | 29 | 0.47 |
| 4(*) | 2.199 | 0.35 | | | 0.48 |
| 5(*) | −3.841 | 0.05 | 1.700 | 36 | 0.58 |
| 6 | ∞ | 1.07 | 1.470 | 65 | 0.66 |
| 7 | ∞ | 0.35 | 1.640 | 23 | 1.35 |
| 8(*) | 25.350 | 0.10 | | | 1.42 |
| 9 | ∞ | 0.50 | 1.516 | 64 | 1.55 |
| 10 | ∞ | 0.23 | | | 1.68 |

Aspheric Surface Coefficient

1st Surface

K = −0.29250E−02
A4 = 0.10932E−01
A6 = −0.11658E+00
A8 = 0.12332E+01
A10 = −0.40135E+01
A12 = 0.50789E+01

TABLE 7-continued f = 3.09 mm, fB = 0.23 mm, F = 2.88, 2Y = 3.5 mm,
ENTP = 0.24 mm, EXTP = −1.91 mm,
H1 = −1.13 mm, H2 = −2.86 mm 4th Surface K = −0.91932E+01
A4 = 0.12531E+00
A6 = 0.43690E+01
A8 = −0.32234E+02
A10 = 0.12860E+03
A12 = −0.16105E+03

5th Surface

K = −0.27383E+02
A4 = −0.65121E+00
A6 = 0.26535E+01
A8 = −0.13377E+02
A10 = 0.27472E+02
A12 = −0.19526E+02

8th Surface

K = 0.14121E+02
A4 = −0.95535E−01
A6 = 0.23530E+00
A8 = −0.44862E+00
A10 = 0.42650E+00
A12 = −0.22243E+00
A14 = 0.60185E−01
A16 = −0.66070E−02

Lens Block Data

| Lens block | Starting surface | End surface | Focal length (mm) |
|---|---|---|---|
| 1 | 1 | 4 | 2.35 |
| 2 | 5 | 8 | −4.72 |

Values corresponding to respective conditional expressions are shown below.

N2b=1.640

D[BK2]/D[BK1]=1.89

N1b=1.610

N2a=1.700

$|f1/f2|=0.50$ $f1b/f1=-1.53$ $v1a-v1b=26.0$ $\omega=29.2°$

FIG. 17 is a cross-sectional view of a lens in Example 7. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate LS2, and of lens portion 2b (L2b) that is concave facing the image side, in this order from the object side. The flat parallel plate PT corresponds to an optical element such as an optical lowpass filter, an infrared blocking filter and a sealing glass of solid-state imaging device. In addition, all surfaces of lens portions which touch with the air are in a form of an aspheric surface. The first lens block BK1 has positive refractive power, while the second lens block BK2 has negative refractive power.

FIG. 17 is a diagram showing aberrations of an image pickup lens in Example 7 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Example 8

Lens data of Example 8 are shown in Table 8.

TABLE 8 f = 2.98 mm, fB = 0.65 mm, F = 2.88, 2Y = 3.5 mm,
ENTP = 0.24 mm, EXTP = −1.49 mm,
H1 = −0.95 mm, H2 = −2.34 mm

| Surface No. | R (mm) | D (mm) | Nd | νd | Effective radius (mm) |
|---|---|---|---|---|---|
| 1(*) | 0.827 | 0.32 | 1.513 | 55 | 0.55 |
| 2 (Diaphragm) | ∞ | 0.39 | 1.520 | 62 | 0.48 |
| 3 | ∞ | 0.05 | 1.640 | 23 | 0.49 |
| 4(*) | 2.186 | 0.32 | | | 0.48 |
| 5(*) | −4.099 | 0.05 | 1.572 | 35 | 0.57 |
| 6 | ∞ | 1.14 | 1.520 | 62 | 0.65 |
| 7 | ∞ | 0.35 | 1.610 | 29 | 1.33 |
| 8(*) | 25.188 | 0.65 | | | 1.41 |

Aspheric Surface Coefficient

1st Surface

K = 0.42426E−02
A4 = 0.29108E−01
A6 = −0.19265E+00
A8 = 0.12593E+01
A10 = −0.34458E+01
A12 = 0.46137E+01

4th Surface

K = 0.40282E+01
A4 = −0.38432E−01
A6 = 0.43119E+01
A8 = −0.32281E+02
A10 = 0.13366E+03
A12 = 0.17412E+03

5th Surface

K = 0.15371E+02
A4 = −0.60685E+00
A6 = 0.25322E+01
A8 = −0.13154E+02
A10 = 0.26798E+02
A12 = −0.18687E+02

8th Surface

K = 0.30000E+02
A4 = −0.10222E+00
A6 = 0.23279E+00
A8 = −0.44391E+00
A10 = 0.42353E+00
A12 = −0.22098E+00
A14 = 0.59866E−01
A16 = −0.66132E−02

Lens Block Data

| Lens block | Starting surface | End surface | Focal length (mm) |
|---|---|---|---|
| 1 | 1 | 4 | 2.39 |
| 2 | 5 | 8 | −5.98 |

Values corresponding to respective conditional expressions are shown below.

N2b=1.610

D[BK2]/D[BK1]=2.03

N1b=1.640

N2a=1.572

$|f1/|f2||=0.40$ $f1b/f1=-1.43$ $\nu 1a - \nu 1b = 32.0$

ω=29.6°

FIG. 19 is a cross-sectional view of a lens in Example 8. The image pickup apparatus includes, in order from the object side, first lens block BK1, second lens block BK2, and parallel flat plate PT, to form an image of the object on image surface IM. The first lens block BK1 is composed of lens portion 1a (L1a) that is convex facing the object side, aperture stop S, first lens substrate LS1 and of lens portion 1b (L1b) that is concave facing the image side in this order from the object side. The second lens block BK2 is composed of lens portion 2a (L2a) that is concave facing the object side, second lens substrate LS2, and of lens portion 2b (L2b) that is concave facing the image side, in this order from the object side. The flat parallel plate PT corresponds to an optical element such as an optical lowpass filter, an infrared blocking filter and a sealing glass of solid-state imaging device. In addition, all surfaces of lens portions which touch with the air are in a form of an aspheric surface. The first lens block BK1 has positive refractive power, while the second lens block BK2 has negative refractive power.

FIG. 20 is a diagram showing aberrations of an image pickup lens in Example 8 including the spherical aberration, astigmatism and distortion. In this case, in the spherical aberration diagram, d represents an amount of spherical aberration for d line and g represents an amount of spherical aberration for g line. Further, in the astigmatism diagram, a solid line shows a saggital surface and a dotted line shows a meridional surface respectively.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The invention claimed is:

1. An image pickup lens comprising, in order from an object side thereof:
    a first lens block with a positive refractive power, comprising
        a first lens substrate being a parallel flat plate, and
        lens portions 1a and 1b arranged on an object side surface and an image side surface of the first lens substrate, each of the lens portions 1a and 1b being different from the first lens substrate in at least one of a refractive index and an Abbe number;
    a second lens block with a negative refractive power, comprising
        a second lens substrate being a parallel flat plate, and
        lens portions 2a and 2b arranged on an object side surface and an image side surface of the second lens substrate, each of the lens portions 2a and 2b being different from the second lens substrate in at least one of a refractive index and an Abbe number; and an aperture stop arranged on the first lens substrate, wherein the image pickup lens has in total a two-lens-block structure, the lens portion 1a is arranged on the object side surface of the first lens substrate, an object side surface of the lens portion 1a is a convex surface facing the object side, the lens portion 1b is arranged on the image side surface of the first lens substrate, an image side surface of the lens portion 1b is a concave surface facing an image side, the lens portion 2a is arranged on the object side surface of the second lens substrate, an object side surface of the lens portion 2a is a concave surface facing the object side, the lens portion 2b is arranged on the image side surface of the second lens substrate, an image side surface of the lens portion 2b is in an aspheric shape, and the image pickup lens satisfies the following expressions:

$1.55 < N2b < 2.0,$ $1.74 < D[BK2]/D[BK1] < 3.0,$ where N2b is a refractive index of the lens portion 2b at d line, D[BK1] is a composite thickness of the first lens block, and D[BK2] is a composite thickness of the second lens block.

2. The image pickup lens of claim 1, wherein the image pickup lens satisfies the following expressions:

$1.51 < N1b < 2.0,$ $1.51 < N2a < 2.0,$ where N1b is a refractive index of the lens portion 1b at d line, and N2a is a refractive index of the lens portion 2a at d line.

3. The image pickup lens of claim 1, wherein the image side surface of the lens portion 2b is in a shape including an inflection point such that the shape is formed in a concave surface facing the image side around an optical axis and is formed in a convex surface facing the image side on a peripheral area.

4. The image pickup lens of claim 1, wherein the image pickup lens satisfies the following expression:

$0.3 < |f1/f2| < 0.8,$ where f1 is a composite focal length of the first lens block, and f2 is a composite focal length of the second lens block.

5. The image pickup lens of claim 1, wherein the image pickup lens satisfies the following expression:

$-2.0 < f1b/f1 < -1.0,$ where f1b is a focal length of the lens portion 1b in air, and f1 is a composite focal length of the first lens block.

6. The image pickup lens of claim 1, wherein the image pickup lens satisfies the following expression:

$10 < \nu 1a - \nu 1b < 50,$ where $\nu 1a$ is an Abbe number of the lens portion 1a, and $\nu 1b$ is an Abbe number of the lens portion 1b.

7. The image pickup lens of claim 1, wherein each of the first lens substrate and the second lens substrate comprises a glass material.

8. The image pickup lens of claim 1, wherein each of the lens portions 1a, 1b, 2a and 2b comprises a resin material.

9. The image pickup lens of claim 8, wherein the resin material in each of the lens portions 1a, 1b, 2a and 2b comprises a curable resin material.

10. The image pickup lens of claim 8, wherein inorganic microparticles of a size of 30 nm or less are dispersed in the resin material in at least one of the lens portions 1a, 1b, 2a and 2b.

11. An image pickup apparatus comprising the image pickup lens of claim 1.

12. A mobile terminal comprising the image pickup apparatus of claim 11.

13. The image pickup lens of claim 1, wherein the image pickup lens satisfies the following expression:

$1.570 < N2b < 2.0.$

* * * * *